(12) United States Patent
Imoto et al.

(10) Patent No.: US 9,397,225 B2
(45) Date of Patent: Jul. 19, 2016

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Yuki Imoto, Atsugi (JP); Tetsunori Maruyama, Atsugi (JP); Yuta Endo, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/602,878

(22) Filed: Jan. 22, 2015

(65) Prior Publication Data

US 2015/0137123 A1    May 21, 2015

Related U.S. Application Data

(62) Division of application No. 13/422,247, filed on Mar. 16, 2012, now Pat. No. 8,956,944.

(30) Foreign Application Priority Data

Mar. 25, 2011 (JP) .................................. 2011-067195

(51) Int. Cl.
  *H01L 21/44* (2006.01)
  *H01L 29/786* (2006.01)
  *H01L 29/66* (2006.01)

(52) U.S. Cl.
  CPC ...... *H01L 29/7869* (2013.01); *H01L 29/66742* (2013.01); *H01L 29/66969* (2013.01); *H01L 29/78603* (2013.01); *H01L 29/78606* (2013.01)

(58) Field of Classification Search
  CPC .. H01L 21/00; H01L 23/26; H01L 2924/1423
  See application file for complete search history.

(56) References Cited

U.S. PATENT DOCUMENTS 5,528,032 A    6/1996    Uchiyama
5,731,856 A    3/1998    Kim et al.
(Continued)

FOREIGN PATENT DOCUMENTS

EP    1737044 A    12/2006
EP    2226847 A    9/2010
(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

(Continued)

*Primary Examiner* — Jaehwan Oh
(74) *Attorney, Agent, or Firm* — Eric J. Robinson; Robinson Intellectual Property Law Office, P.C.

(57) ABSTRACT

In the transistor including an oxide semiconductor film, which includes a film for capturing hydrogen from the oxide semiconductor film (a hydrogen capture film) and a film for diffusing hydrogen (a hydrogen permeable film), hydrogen is transferred from the oxide semiconductor film to the hydrogen capture film through the hydrogen permeable film by heat treatment. Specifically, a base film or a protective film of the transistor including an oxide semiconductor film has a stacked-layer structure of the hydrogen capture film and the hydrogen permeable film. At this time, the hydrogen permeable film is formed on a side which is in contact with the oxide semiconductor film. After that, hydrogen released from the oxide semiconductor film is transferred to the hydrogen capture film through the hydrogen permeable film by the heat treatment.

24 Claims, 18 Drawing Sheets

(56) References Cited

U.S. PATENT DOCUMENTS

| | | | |
|---|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,166,889 B2 | 1/2007 | Tsunoda et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,910,457 B2 * | 3/2011 | Yamazaki | H01L 21/02131 257/618 |
| 7,910,490 B2 | 3/2011 | Akimoto et al. |
| 7,932,521 B2 | 4/2011 | Akimoto et al. |
| 8,367,486 B2 | 2/2013 | Sakata |
| 8,384,078 B2 * | 2/2013 | Kang | H01L 27/3276 257/347 |
| 8,426,852 B2 * | 4/2013 | Lee | H01L 29/78606 257/43 |
| 8,822,991 B2 | 9/2014 | Sakata |
| 8,956,944 B2 * | 2/2015 | Imoto | H01L 29/78603 257/43 |
| 2001/0046027 A1 | 11/2001 | Tai et al. |
| 2002/0043660 A1 | 4/2002 | Yamazaki et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0283916 A1 * | 11/2008 | Yamazaki | H01L 21/02131 257/347 |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0045179 A1 | 2/2010 | Sano et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0109058 A1 * | 5/2010 | Sakata | C23C 14/0057 257/288 |
| 2010/0136743 A1 | 6/2010 | Akimoto et al. |
| 2010/0233847 A1 | 9/2010 | Ohara et al. |
| 2010/0295041 A1 | 11/2010 | Kumomi et al. |
| 2011/0006299 A1 * | 1/2011 | Abe | H01L 21/02565 257/43 |
| 2011/0017997 A1 | 1/2011 | Kamath et al. |
| 2011/0079777 A1 | 4/2011 | Akimoto |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0127519 A1 * | 6/2011 | Kang | H01L 27/3244 257/43 |
| 2011/0133176 A1 * | 6/2011 | Lee | H01L 29/78606 257/43 |
| 2011/0140205 A1 | 6/2011 | Sakata et al. |
| 2011/0163311 A1 | 7/2011 | Akimoto et al. |
| 2012/0241736 A1 * | 9/2012 | Imoto | H01L 29/7869 257/43 |
| 2012/0241737 A1 * | 9/2012 | Imoto | H01L 29/78603 257/43 |
| 2012/0241738 A1 * | 9/2012 | Imoto | H01L 29/7869 257/43 |
| 2012/0244659 A1 * | 9/2012 | Imoto | H01L 29/66969 438/104 |
| 2013/0285044 A1 * | 10/2013 | Yuan | H01L 29/4908 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |

(56) References Cited

FOREIGN PATENT DOCUMENTS

| JP | 63-239117 A | 10/1988 |
|---|---|---|
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-297956 A | 10/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2006-253303 A | 9/2006 |
| JP | 2007-096055 A | 4/2007 |
| JP | 2007-123861 A | 5/2007 |
| JP | 2008-141119 A | 6/2008 |
| JP | 2010-073733 A | 4/2010 |
| TW | 201044581 | 12/2010 |
| WO | WO-2004/114391 | 12/2004 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MOO_3$ as a Charge-Generation Layer", Adv. Mater (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Park,J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems"; Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—GA—Zn—Oxide TFTS", IDW '09 : Proceedings of the 16th International Display Workshops, 2009, pp. 689-692.

(56) References Cited

OTHER PUBLICATIONS

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.
Park.S et al., "Challenge to Future Displays: Transparent AM-OLED Driven by PEALD Grown ZnO TFT", IMID '07 Digest, 2007, pp. 1249-1252.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTS With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED ", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "Spinel,YbBFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Left. (Applied Physics Letters), 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using Castep", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator", Appl. Phys. Lett. (Applied PHysics Letters), Sep. 1, 2003, vol. 83, No. 9, pp. 1755-1757.
Taiwanese Office Action (Application No. 101109510) Dated Sep. 17, 2015.

* cited by examiner

SEMICONDUCTOR DEVICE AND METHOD FOR MANUFACTURING THE SAME

BACKGROUND OF THE INVENTION

1. Field of the Invention

The present invention relates to a semiconductor device which is provided with a circuit including a semiconductor element such as a transistor. For example, the present invention relates to a power device which is mounted on a power supply circuit, a semiconductor integrated circuit including a memory, a thyristor, a converter, an image sensor, or the like, an electro-optical device typified by a liquid crystal display device, a light-emitting display device including a light-emitting element, and the like; and an electronic device on which any of the above circuit and devices are mounted as a component.

In this specification, a semiconductor device generally refers to a device which can function by utilizing semiconductor characteristics; an electro-optical device, a light-emitting display device, a semiconductor circuit, and an electronic device are all included in the category of the semiconductor device.

2. Description of the Related Art

Many transistors formed over a glass substrate or the like are manufactured using amorphous silicon, polycrystalline silicon, or the like, as typically seen in liquid crystal display devices. Although transistors formed using amorphous silicon have low field-effect mobility, they can be formed over a larger glass substrate. On the other hand, although transistors formed using polycrystalline silicon have high field-effect mobility, they are not suitable for being formed over a larger glass substrate.

Other than a transistor formed using silicon, in recent years, a technique in which a transistor is formed using an oxide semiconductor and applied to an electronic device or an optical device has attracted attention. For example, a technique of forming a transistor by using zinc oxide or In—Ga—Zn—O-based oxide as an oxide semiconductor, and of using the transistor for a switching element of a pixel of a display device and the like is disclosed in Patent Document 1 and Patent Document 2.

In an oxide semiconductor, part of hydrogen serves as a donor to release electrons as carriers. When the carrier concentration in the oxide semiconductor becomes high, a channel is formed in a transistor without voltage application to a gate. That is, the threshold voltage of the transistor shifts to the negative direction. It is difficult to remove hydrogen in the oxide semiconductor completely; therefore, it is also difficult to control the threshold voltage.

In Patent Document 3, it is disclosed that when hydrogen is added in an oxide semiconductor film, electrical conductivity of the oxide semiconductor is increased by approximately four to five orders of magnitude. In addition, it is disclosed that hydrogen is diffused into the oxide semiconductor film from an insulating film which is in contact with the oxide semiconductor film.

REFERENCE

[Patent Document 1] Japanese Published Patent Application No. 2007-123861
[Patent Document 2] Japanese Published Patent Application No. 2007-096055
[Patent Document 3] Japanese Published Patent Application No. 2008-141119

SUMMARY OF THE INVENTION

An object of one embodiment of the present invention is to manufacture a highly reliable semiconductor device by giving stable electric characteristics to a transistor including an oxide semiconductor film.

A technical idea of one embodiment of the present invention is as follows: in a transistor including an oxide semiconductor film, which includes a film for capturing or absorbing hydrogen from the oxide semiconductor film (a hydrogen capture film or a hydrogen absorption film) and a film for diffusing hydrogen (a hydrogen permeable film), hydrogen is transferred from the oxide semiconductor film to the hydrogen capture film through the hydrogen permeable film by heat treatment.

Specifically, a base film or a protective film of the transistor including an oxide semiconductor film has a stacked-layer structure of the hydrogen capture film and the hydrogen permeable film. At this time, the hydrogen permeable film is formed on a side which is in contact with the oxide semiconductor film. After that, hydrogen released from the oxide semiconductor film is transferred to the hydrogen capture film through the hydrogen permeable film by the heat treatment.

Note that the hydrogen concentration in the vicinity of the interface of the oxide semiconductor film can be reduced by providing the hydrogen permeable film between the oxide semiconductor film and the hydrogen capture film.

A highly reliable semiconductor device can be manufactured by giving stable electric characteristics to a transistor including an oxide semiconductor film.

DETAILED DESCRIPTION OF THE INVENTION

Figure 1A:
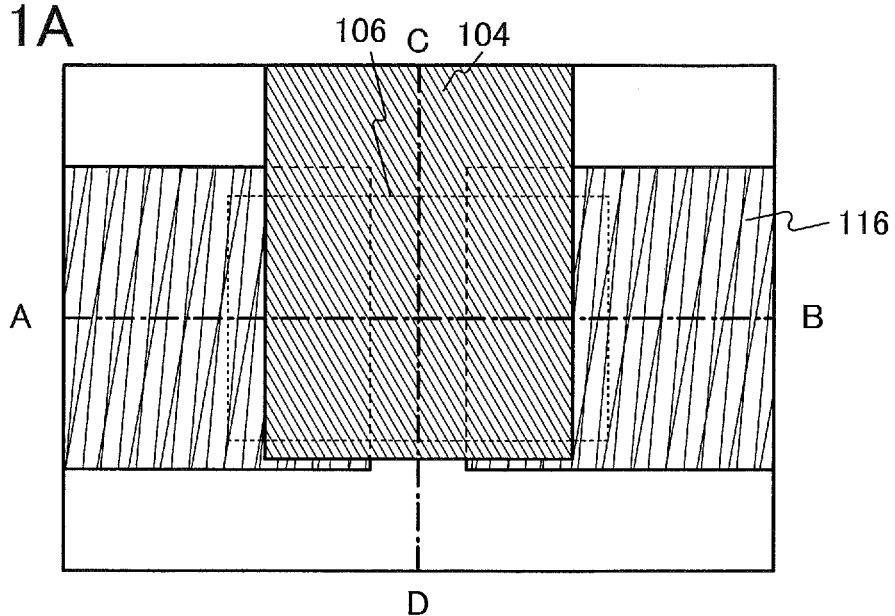
FIGS. 1A to 1C are a top view and cross-sectional views illustrating an example of a semiconductor device according to one embodiment of the present invention.

Embodiments of the present invention will be described below in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments below. In describing structures of the present invention with reference to the drawings, the same reference numerals are used in common for the same portions in different drawings. Note that the same hatch pattern is applied to similar parts, and the similar parts are not especially denoted by reference numerals in some cases.

Before the present invention is described, terms used in this specification will be briefly explained. First, when one of a source and a drain of a transistor is called a drain, the other is called a source in this specification. That is, they are not distinguished depending on the potential level. Therefore, a portion called a source in this specification can be alternatively referred to as a drain.

Note that voltage refers to a potential difference between a predetermined potential and a reference potential (e.g., a ground potential) in many cases. Note that voltage can also be referred to as potential.

Further, even when the expression "to be connected" is used in this specification, there is a case in which no physical connection is made in an actual circuit and a wiring is just extended.

Note that the ordinal numbers such as "first" and "second" in this specification are used for convenience and do not denote the order of steps or the stacking order of layers. In addition, the ordinal numbers in this specification do not denote particular names which specify the present invention.

Embodiment 1

In this embodiment, an example of a transistor of one embodiment of the present invention will be described with reference to FIGS. 1A to 1C.

FIG. 1A is a top view of the transistor. A cross section along the dashed-dotted line A-B in FIG. 1A and a cross section along the dashed-dotted line C-D in FIG. 1A correspond to a cross section A-B in FIG. 1B and a cross section C-D in FIG. 1C, respectively.

Here, the cross section A-B in FIG. 1B will be described in detail.

The transistor includes a substrate 100, a base film 102 which is over the substrate 100 and includes a first base film 102a and a second base film 102b over the first film 102a, an oxide semiconductor film 106 over the base film 102, a pair of electrodes 116 which is over the oxide semiconductor film 106 and is partly in contact with the oxide semiconductor film 106, a gate insulating film 112 over the oxide semiconductor film 106 and the pair of electrodes 116, and a gate electrode 104 overlapping with the oxide semiconductor film 106 with the gate insulating film 112 provided therebetween.

Here, a hydrogen capture film is used for the first base film 102a, and a hydrogen permeable film is used for the second base film 102b. Note that the hydrogen concentration in the vicinity of the interface of the oxide semiconductor film can be reduced by providing the hydrogen permeable film between the oxide semiconductor film and the hydrogen capture film.

The first base film 102a can be formed using an oxynitride film containing indium nitride (or indium). Specifically, a compound material containing in addition to at least indium nitride, at least one or more kinds of indium oxide, gallium oxide, zinc oxide, tin oxide, aluminum oxide, tungsten oxide, molybdenum oxide, titanium oxide, tantalum oxide, and silicon oxide can be used. Note that an oxynitride refers to a compound in which nitrogen is substituted for part of oxygen included in an oxide.

For example, the nitrogen concentration in the first base film 102a can be higher than or equal to 0.01 atomic % and lower than 7 atomic %. An oxynitride film containing indium nitride whose nitrogen concentration is greater than or equal to 0.01 atomic % and less than 7 atomic % has a high insulating property. Alternatively, the nitrogen concentration in the first base film 102a can be higher than or equal to 7 atomic and lower than or equal to 20 atomic %. An oxynitride film containing indium nitride whose nitrogen concentration is greater than or equal to 7 atomic % and less than or equal to 20 atomic % in some cases has a high conductivity when bonding to hydrogen. At this time, leakage of electric charges from the pair of electrodes 116 through the first base film 102a can be prevented owing to the second base film 102b having a high insulating property. Note that the nitrogen concentration in the first base film 102a can be quantified by X-ray photoelectron spectroscopy (XPS) analysis.

Part of hydrogen contained in the oxynitride film containing indium nitride releases electrons serving as carriers. Since an electron has a negative charge, an electric field is generated in a manner similar to the case where a negative bias is applied from a back gate electrode, so that the threshold voltage of the transistor is shifted to the positive direction. In the transistor including the oxide semiconductor film, parts of oxygen vacancies and part of hydrogen in the oxide semiconductor film release electrons serving as carriers, whereby the threshold voltage of the transistor tends to shift to the negative direction. Therefore, in some cases, it is preferable to shift the threshold voltage of the transistor to the positive direction by the negative charges of the oxynitride film containing indium nitride. Note that the amount of negative charges can be adjusted by controlling the hydrogen concentration in the first base film 102a. The hydrogen concentration in the first base film 102a can be adjusted by the nitrogen concentration in the first base film 102a.

The hydrogen concentration in the first base film 102a is greater than or equal to $1\times10^{19}$ cm$^{-3}$ and less than or equal to $5\times10^{20}$ cm$^{-3}$, preferably greater than or equal to $1\times10^{20}$ cm$^{-3}$ and less than or equal to $3\times10^{20}$ cm$^{-3}$. Note that the hydrogen concentration in the first base film 102a can be quantified by secondary ion mass spectrometry (SIMS).

As the second base film 102b, an oxide film having a high insulating property is used. For example, a silicon oxide film or a silicon oxynitride film can be used. Note that the thickness of the second base film 102b is greater than or equal to 0.5 nm and less than or equal to 15 nm, preferably greater than or equal to 2 nm and less than or equal to 5 nm. It is possible to diffuse hydrogen at a lower temperature when the thickness of the second base film 102b is smaller. The second base film 102b may be a film from which oxygen is released by heat treatment.

Here, silicon oxynitride refers to a substance that contains more oxygen than nitrogen and, silicon oxynitride preferably contains oxygen, nitrogen, silicon, and hydrogen at concentrations ranging from greater than or equal to 50 atomic % and less than or equal to 70 atomic %, greater than or equal to 0.5 atomic % and less than or equal to 15 atomic %, greater than or equal to 25 atomic % and less than or equal to 35 atomic %, and greater than or equal to 0 atomic % and less than or equal to 10 atomic %, respectively. Note that the above ranges are ranges for cases where measurement is performed using Rutherford backscattering spectrometry (RBS) and hydrogen forward scattering spectrometry (HFS). In addition, the total of the percentages of the constituent elements does not exceed 100 atomic %.

The hydrogen concentration in the oxide semiconductor film 106 is less than $1\times10^{19}$ cm$^{-3}$, preferably less than or equal to $5\times10^{18}$ cm$^{-3}$. The hydrogen concentration in the oxide semiconductor film 106 can be quantified by SIMS.

Here, alkali metals are not elements which compose an oxide semiconductor, and therefore, are impurities. In addition, alkaline earth metals are also impurities in the case where the alkaline earth metals do not compose oxide semiconductor. Alkali metals, in particular, Na diffuses in an insulating film which is in contact with the oxide semiconductor film and Na becomes Na$^+$. In addition, in the oxide semiconductor film, Na cuts or enters a bond between a metal and oxygen which are included in the oxide semiconductor. As a result, for example, deterioration of electric characteristics of the transistor such as a normally-on state of the transistor due to shift of a threshold voltage to the negative direction or a reduction in field-effect mobility occurs; in addition, variation in electric characteristics of the transistor is also caused. Such deterioration of electric characteristics of the transistor and variation in electric characteristics of the transistor due to the impurity remarkably appear when the hydrogen concentration in the oxide semiconductor film is sufficiently low. Therefore, when the hydrogen concentration in the oxide semiconductor film is less than or equal to $1\times10^{18}$ cm$^{-3}$ or less than or equal to $1\times10^{17}$ cm$^{-3}$, the impurity concentration is preferably reduced. Specifically, the measurement value of Na concentration is preferably less than or equal to $5\times10^{-16}$ cm$^{-3}$, more preferably less than or equal to $1\times10^{16}$ cm$^{-3}$, still more preferably less than or equal to $1\times10^{15}$ cm$^{-3}$. In addition, the measurement value of lithium (Li) concentration is preferably less than or equal to $5\times10^{15}$/cm$^{-3}$, more preferably less than or equal to $1\times10^{15}$/cm$^{-3}$. In addition, the measurement value of potassium (K) concentration is preferably less than or equal to $5\times10^{15}$/cm$^{-3}$, more preferably less than or equal to $1\times10^{15}$/cm$^{-3}$.

The off-state current of the transistor including the oxide semiconductor film 106 described above can be significantly reduced. For example, the off-state current of the transistor where the channel length is 3 μm and the channel width is 1 μm is less than or equal to $1\times10^{-18}$ A, less than or equal to $1\times10^{-21}$ A, or less than or equal to $1\times10^{24}$ A.

For the oxide semiconductor film 106, for example, a material including two or more kinds of elements selected from In, Ga, Zn, and Sn can be used.

The oxide semiconductor film 106 is formed using a material whose band gap is greater than or equal to 2.5 eV, preferably greater than or equal to 3.0 eV in order to reduce the off-state current of the transistor.

As a material used for the oxide semiconductor film 106, any of the following can be used, for example: an In—Sn—Ga—Zn—O-based material; an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material; an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; an In—O-based material, a Sn—O-based material, or a Zn—O-based material; and the like. Here, for example, an In—Ga—Zn—O-based material means an oxide containing indium (In), gallium (Ga), and zinc (Zn), and there is no particular limitation on the composition ratio. Further, the In—Ga—Zn—O-based material may contain an element other than In, Ga, and Zn. In this case, the amount of oxygen in the oxide semiconductor film 106 is preferably in excess of that in the stoichiometric composition ratio. When the amount of oxygen is in excess of the stoichiometric composition ratio, generation of carriers which result from oxygen vacancies in the oxide semiconductor film 106 can be suppressed.

Note that in the case where an In—Zn—O-based material is used for the oxide semiconductor film 106 as an example, the atomic ratio thereof is set so that In/Zn is greater than or equal to 0.5 and less than or equal to 50, preferably greater than or equal to 1 and less than or equal to 20, more preferably greater than or equal to 1.5 and less than or equal to 15. When the atomic ratio of Zn is in the above range, the field-effect mobility of the transistor can be improved. Here, when the atomic ratio of the compound is In:Zn:O=X:Y:Z, the relation of Z>1.5X+Y is preferably satisfied.

Alternatively, a material represented by a chemical formula, $InMo_3(ZnO)_m$ (m>0) may be used for the oxide semiconductor film 106. Here, M represents one or more metal elements selected from Ga, Al, Mn, and Co. For example, M may be Ga, Ga and Al, Ga and Mn, Ga and Co, or the like.

It is preferable that the oxide semiconductor film 106 be formed using a material including a metal element which is the same as the metal element included in the first base film 102a. This is because in the case where a sputtering method is employed, the films can be deposited separately in accordance with deposition gases with the use of the same target and the material cost and the apparatus cost can be reduced. For example, in the case where an In—Ga—Zn—O film is used as the oxide semiconductor film 106, an In—Ga—Zn—O—N film can be used as the first base film 102*a*.

The oxide semiconductor film 106 is in a single crystal state, a polycrystalline (also referred to as polycrystal) state, an amorphous state, or the like.

The oxide semiconductor film 106 is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

The gate insulating film 112 can be formed to have a single-layer structure or a stacked-layer structure using one or more of silicon oxide, silicon oxynitride, silicon nitride oxide, silicon nitride, aluminum oxide, zirconium oxide, yttrium oxide, hafnium oxide, and the like by, for example, a plasma-enhanced CVD method, a sputtering method, an ALD method, or the like. A film from which oxygen is released by heat treatment is preferably used for the gate insulating film 112. With the use of such a film from which oxygen is released by heat treatment, oxygen vacancies generated in the oxide semiconductor film 106 can be repaired and deterioration in electric characteristics of the transistor can be suppressed.

Here, silicon nitride oxide refers to a substance that contains more nitrogen than oxygen and, silicon nitride oxide preferably contains oxygen, nitrogen, silicon, and hydrogen at concentrations ranging from higher than or equal to 5 atomic % and lower than or equal to 30 atomic %, higher than or equal to 20 atomic % and lower than or equal to 55 atomic %, higher than or equal to 25 atomic % and lower than or equal to 35 atomic %, and higher than or equal to 10 atomic % and lower than or equal to 25 atomic %, respectively. Note that the above ranges are ranges for cases where measurement is performed using RBS and HFS. In addition, the total of the percentages of the constituent elements does not exceed 100 atomic %.

To release oxygen by heat treatment means that the released amount of oxygen which is converted into oxygen atoms is greater than or equal to $1.0 \times 10^{18}$ cm$^{-3}$ or greater than or equal to $1.0 \times 10^{20}$ cm$^{-3}$ in thermal desorption spectroscopy (TDS) analysis.

Here, a method in which the amount of released oxygen is measured using TDS analysis will be described below.

The amount of released gas in TDS analysis is proportional to the integral value of ion intensity. Therefore, the amount of released gas can be calculated from the ratio between the integral value of measured ion intensity and the reference value of a standard sample. The reference value of a standard sample refers to, in a sample containing an atom at a predetermined density, the ratio of the density of the atom to the integral value of ion intensity corresponding to the atom.

For example, the amount of the released oxygen molecules ($N_{O2}$) from an insulating film can be found according to Equation 1 with the TDS analysis results of a silicon wafer containing hydrogen at a predetermined density, which is the standard sample, and the TDS analysis results of the insulating film. Here, all gases having a mass number (or mass-to-charge ratio) of 32 which are obtained by the TDS analysis are assumed to originate from an oxygen molecule. CH$_3$OH, which is given as a gas having a mass number of 32, is not taken into consideration on the assumption that it is unlikely to be present. Further, an oxygen molecule including an oxygen atom having a mass number of 17 or 18 which is an isotope of an oxygen atom is not taken into consideration either because the proportion of such a molecule in the natural world is minimal.

$$N_{O2} = N_{H2}/S_{H2} \times S_{O2} \times \alpha \qquad \text{(Equation 1)}$$

$N_{H2}$ is the value obtained by conversion of the amount of hydrogen molecules desorbed from the standard sample into densities. $S_{H2}$ is the integral value of ion intensity when the standard sample is subjected to TDS analysis. Here, the reference value of the standard sample is set to $N_{H2}/S_{H2}$. $S_{O2}$ is the integral value of ion intensity when the insulating film is subjected to TDS analysis. $\alpha$ is a coefficient affecting the ion intensity in the TDS analysis. Japanese Published Patent Application No. H6-275697 is to be referred to for details of Equation 1. Note that the amount of released oxygen from the above insulating film is measured with a thermal desorption spectroscopy apparatus produced by ESCO Ltd., EMD- WA1000S/W using a silicon wafer containing a hydrogen atom at $1\times10^{16}$ cm$^{-3}$ as the standard sample.

Further, in the TDS analysis, oxygen is partly detected as an oxygen atom. The ratio between oxygen molecules and oxygen atoms can be calculated from the ionization rate of the oxygen molecules. Note that since the above a includes the ionization rate of the oxygen molecules, the amount of the released oxygen atoms can be estimated through the evaluation of the amount of the released oxygen molecules.

Note that $N_{O2}$ is the number of the released oxygen molecules. The amount of released oxygen when converted into oxygen atoms is twice the number of the released oxygen molecules.

In the above structure, the film from which oxygen is released by heat treatment may be oxygen-excess silicon oxide (SiO$_X$(X>2)). In the oxygen-excess silicon oxide (SiO$_X$ (X>2)), the number of oxygen atoms per unit volume is more than twice the number of silicon atoms per unit volume. The number of silicon atoms and the number of oxygen atoms per unit volume are measured by RBS.

By supplying (or transferring) oxygen from the gate insulating film 112 to the oxide semiconductor film 106, the interface state density at the interface between the oxide semiconductor film 106 and the gate insulating film 112 can be decreased. As a result, carrier trapping due to an operation of the transistor or the like at the interface between the oxide semiconductor film 106 and the gate insulating film 112 can be suppressed; thus, a transistor with less deterioration in electric characteristics can be obtained.

Further, in some cases, electric charges are generated owing to oxygen vacancies in the oxide semiconductor film 106. In general, parts of oxygen vacancies in an oxide semiconductor film serve as a donor to release electrons as carriers. As a result, the threshold voltage of a transistor shifts to the negative direction. When oxygen is sufficiently supplied (or diffused) from the gate insulating film 112 to the oxide semiconductor film 106, oxygen vacancies in the oxide semiconductor film 106 which cause the shift of the threshold voltage to the negative direction can be reduced.

In other words, when the film from which oxygen is released by heat treatment is provided as the gate insulating film 112, the interface state density at the interface between the oxide semiconductor film 106 and the gate insulating film 112 and the oxygen vacancies in the oxide semiconductor film 106 can be reduced. Thus, the influence of carrier trapping at the interface between the oxide semiconductor film 106 and the gate insulating film 112 can be reduced.

It is preferable to reduce the hydrogen concentration in the oxide semiconductor film 106 with the oxygen vacancies, which cause the shift of the threshold voltage of the transistor to the negative direction, removed in such a manner as much as possible.

There is no particular limitation on the substrate 100 as long as it has heat resistance enough to withstand at least heat treatment performed later. For example, a glass substrate, a ceramic substrate, a quartz substrate, a sapphire substrate, or the like may be used as the substrate 100. Alternatively, a single crystal semiconductor substrate or a polycrystalline semiconductor substrate made of silicon, silicon carbide, or the like; a compound semiconductor substrate made of silicon germanium or the like; a silicon-on-insulator (SOI) substrate; or the like can be used as the substrate 100. Still alternatively, any of these substrates further provided with a semiconductor element may be used as the substrate 100.

Further alternatively, a flexible substrate may be used as the substrate 100. In that case, a transistor can be formed directly on the flexible substrate. Note that as a method for forming a transistor over a flexible substrate, there is also a method in which, after a transistor is formed over a non-flexible substrate, the transistor is separated and transferred to the substrate 100 which is a flexible substrate. In that case, a separation layer is preferably provided between the non-flexible substrate and the transistor.

The gate electrode 104 can be formed to have a single-layer structure or a stacked-layer structure using one or more of the following materials: Al, Ti, Cr, Co, Ni, Cu, Y, Zr, Mo, Ag, Ta, and W, a nitride of any of these elements, an oxide of any of these elements, and an alloy of any of these elements.

Figure 1B:
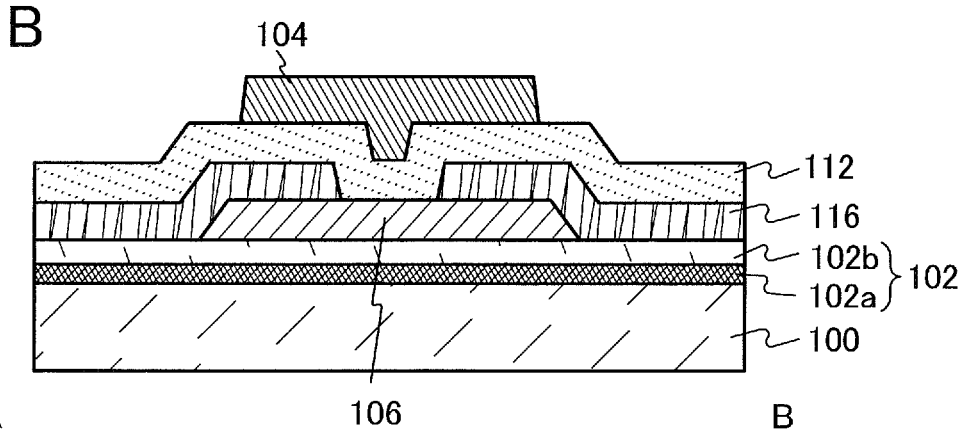
Figure 1C:
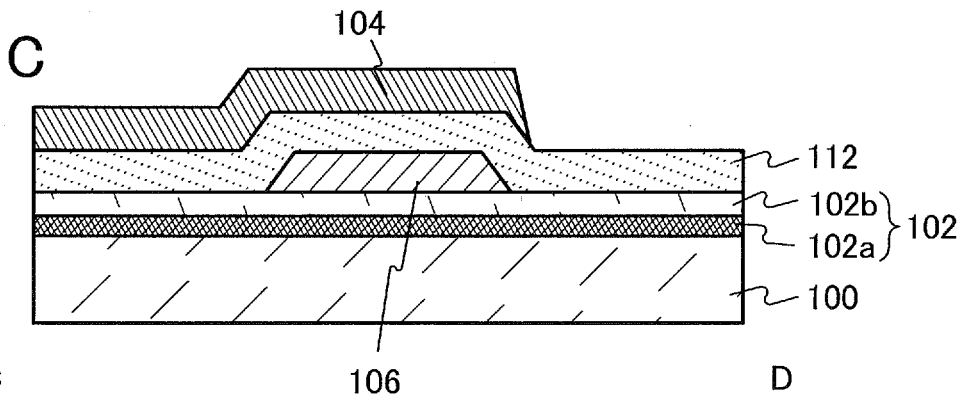

Although, in FIGS. 1A to 1C, the gate electrode 104 does not completely cover the oxide semiconductor film 106, the oxide semiconductor film 106 may be completely covered with the gate electrode 104 in order to prevent light from causing degradation of the oxide semiconductor film 106 and generation of an electric charge in the oxide semiconductor film 106.

The pair of electrodes 116 can be formed with a single-layer structure or a stacked-layer structure using a metal film, a metal nitride film, a metal oxide film, an alloy film, or the like given for the gate electrode 104.

When a film including Cu is used for the pair of electrodes 116, the wiring resistance can be reduced, and wiring delay or the like can be prevented even in a large-sized display device or the like. In the case where Cu is used for the pair of electrodes 116, the adhesion depends on the material of the substrate 100; in such a case, it is preferable to employ a stacked-layer structure using a film having favorable adhesion property to the substrate 100. As the film having favorable adhesion property to the substrate 100, a film including Ti, Mo, Mn, Cu, or Al can be used. For example, a Cu—Mn—Al alloy may be used.

Next, a method for manufacturing the transistor illustrated in FIGS. 1A to 1C will be described with reference to FIGS. 7A to 7D.

First, the base film 102 is formed by depositing a stack of the first base film 102a and the second base film 102b in this order over the substrate 100. Next, an oxide semiconductor film 136 is deposited by a sputtering method or the like (see FIG. 7A).

The first base film 102a can be deposited by a plasma-enhanced CVD method, a sputtering method, a pulsed laser deposition (PLD) method, an atomic layer deposition (ALD) method, or the like. For example, in the case where a sputtering method is employed, a target including at least indium oxide is used. As the target, in addition to indium oxide, a material including at least one of gallium oxide, zinc oxide, tin oxide, aluminum oxide, tungsten oxide, molybdenum oxide, titanium oxide, tantalum oxide, and silicon oxide may be used. Note that at least nitrogen may be contained in the deposition gas. As the deposition gas, at least one of a rare gas (such as helium, neon, argon, krypton, or xenon) and oxygen may be used. By depositing the first base film 102a in such a manner, the nitrogen concentration in the first base film 102a including at least indium nitride is greater than or equal to 0.01 atomic % and less than 7 atomic % or greater than or equal to 7 atomic % and less than or equal to 20 atomic %.

As the second base film 102b, a silicon oxide film or a silicon oxynitride film can be deposited by a plasma-enhanced CVD method, a sputtering method, a PLD method, an ALD method, or the like.

Figure 7A:
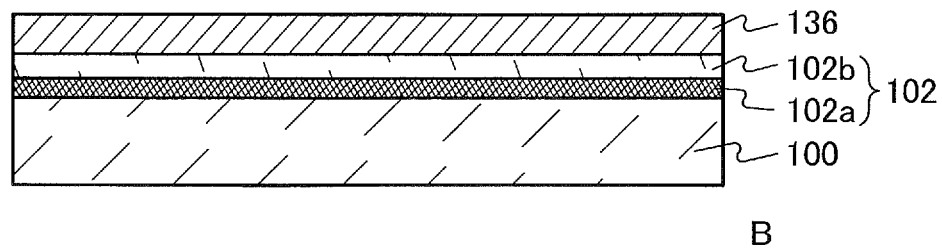
FIGS. 7A to 7D are cross-sectional views illustrating an example of a method for manufacturing a semiconductor device corresponding to the semiconductor device in FIGS. 1A to 1C.
Figure 7B:
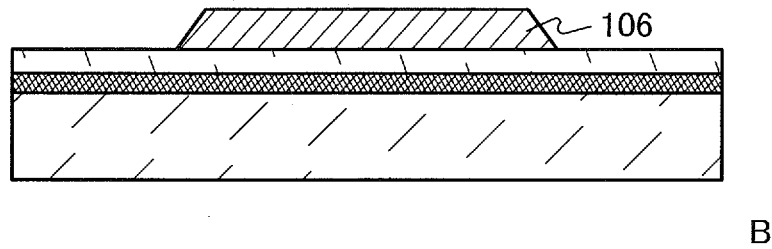
Figure 7C:
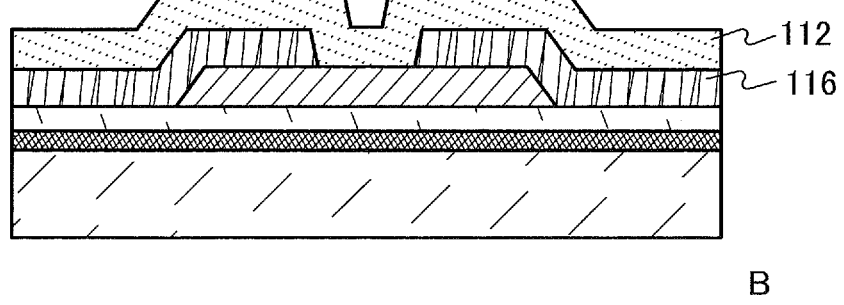

Next, the oxide semiconductor film 136 is processed to form the oxide semiconductor film 106 (see FIG. 7B). After that, heat treatment is performed at a temperature higher than 450° C. and lower than the strain point of the substrate 100, preferably higher than or equal to 500° C. and lower than or equal to 650° C. to transfer hydrogen released from the oxide semiconductor film 106 to the first base film 102a through the second base film 102b. The transferred hydrogen is captured by the first base film 102a. At this time, the hydrogen concentration in the oxide semiconductor film 106 is less than $1\times10^{19}$ cm$^{-3}$, preferably less than or equal to $5\times10^{18}$ cm$^{-3}$. The hydrogen concentration in the first base film 102a is greater than or equal to $1\times10^{19}$ cm$^{-3}$ and less than or equal to $5\times10^{20}$ cm$^{-3}$, preferably greater than or equal to $1\times10^{20}$ cm$^{-3}$ and less than or equal to $3\times10^{20}$ cm$^{-3}$. Note that in the case where a film from which oxygen is released by heat treatment is provided as the second base film 102b, oxygen can be transferred from the second base film 102b to the oxide semiconductor film 106 by the heat treatment. Thus, the interface state density at the interface between the oxide semiconductor film 106 and the second base film 102b and the oxygen vacancies in the oxide semiconductor film 106 can be reduced.

Next, a conductive film is deposited over the oxide semiconductor film 106 and is processed to form the pair of electrodes 116 which is in contact with at least part of the oxide semiconductor film 106. Then, the gate insulating film 112 is deposited over the oxide semiconductor film 106 and the pair of electrodes 116 (see FIG. 7C). The conductive film to be the pair of electrodes 116 can be deposited using the above material by a sputtering method, a plasma-enhanced CVD method, a PLD method, an ALD method, an evaporation method, a printing method, or the like.

Figure 7D:
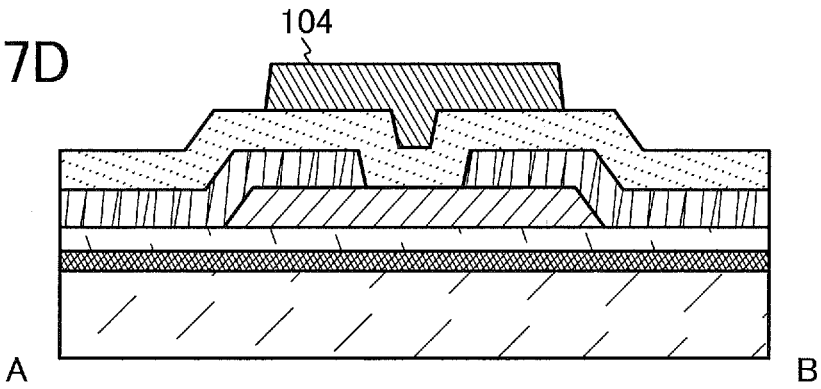

Next, a conductive film is deposited over the gate insulating film 112 and is processed to form the gate electrode 104 overlapping with the oxide semiconductor film 106 (see FIG. 7D). The conductive film to be the gate electrode 104 can be deposited using the above material by a sputtering method, a plasma-enhanced CVD method, a PLD method, an ALD method, an evaporation method, a printing method, or the like.

Note that heat treatment similar to the heat treatment performed after the formation of the oxide semiconductor film 106 may be performed after the formation of the gate insulating film 112 or the gate electrode 104 instead.

As described above, hydrogen is transferred from the oxide semiconductor film 106 to the first base film 102a through the second base film 102b and the transferred hydrogen is captured by the first base film 102a, whereby the highly purified oxide semiconductor film 106 can be formed. Therefore, a highly reliable semiconductor device in which the off-state current of the transistor is significantly small and the electric characteristics are stable can be manufactured.

The threshold voltage of the transistor can be shifted to the positive direction by the operation of negative charges which are generated due to part of the hydrogen captured by the first base film 102a.

Through the process described above, the transistor illustrated in FIGS. 1A to 1C can be formed.

Next, a transistor having a structure different from that of the transistor illustrated in FIGS. 1A to 1C will be described with reference to FIGS. 2A to 2C.

Figure 2A:
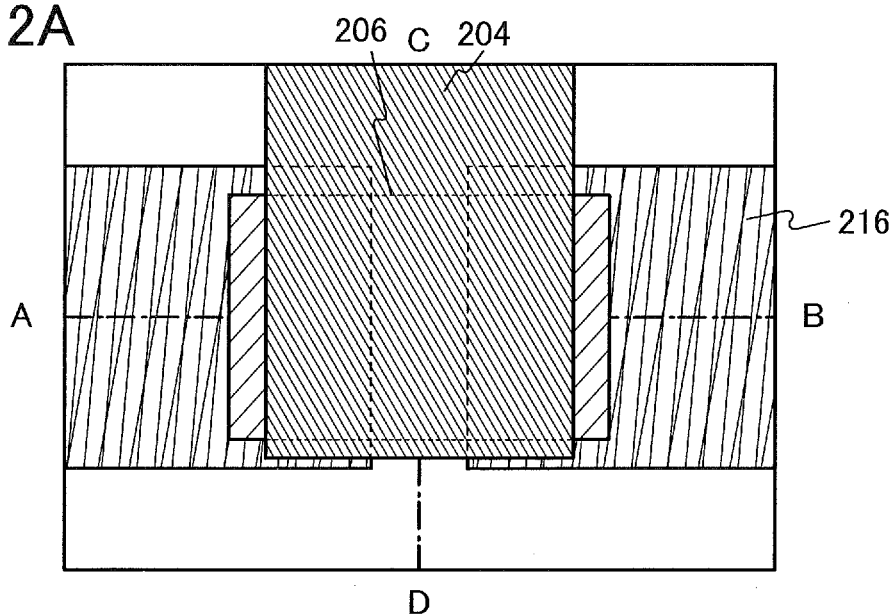
FIGS. 2A to 2C are a top view and cross-sectional views illustrating an example of a semiconductor device according to one embodiment of the present invention.
Figure 2B:
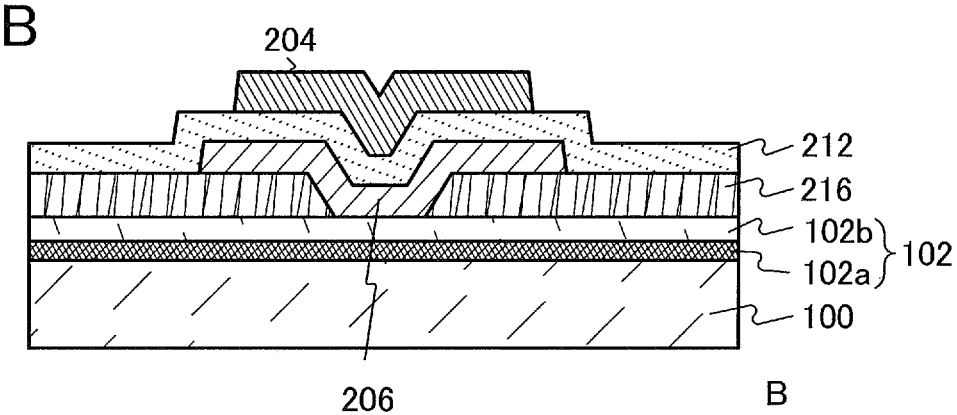
Figure 2C:
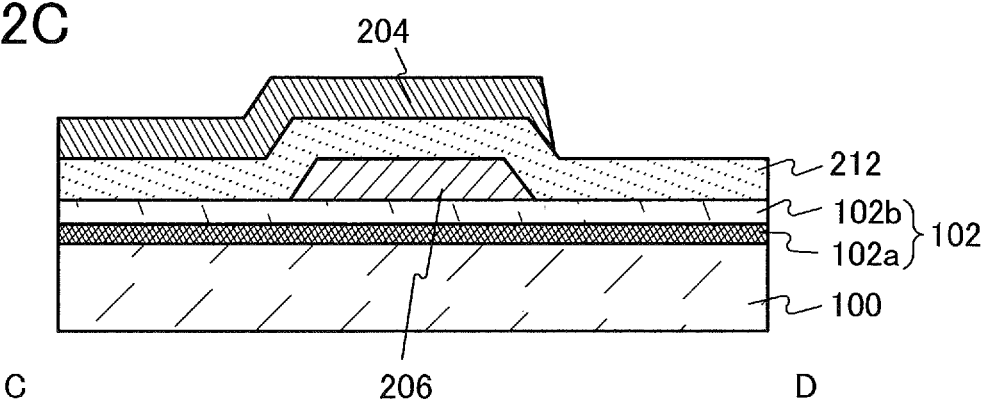

FIGS. 2A to 2C are a top view and cross-sectional views of a transistor. A cross section along the dashed-dotted line A-B in FIG. 2A and a cross section along the dashed-dotted line C-D in FIG. 2A correspond to a cross section A-B in FIG. 2B and a cross section C-D in FIG. 2C, respectively.

The cross section A-B in FIG. 2B will be described below in detail.

The transistor illustrated in FIGS. 2A to 2C includes the substrate 100, the base film 102 which is over the substrate 100 and includes the first base film 102a and the second base film 102b over the first base film 102a, a pair of electrodes 216 over the base film 102, an oxide semiconductor film 206 which is over the pair of electrodes 216 and is in contact with at least part of the pair of electrodes 216, a gate insulating film 212 over the oxide semiconductor film 206 and the pair of electrodes 216, and a gate electrode 204 overlapping with the oxide semiconductor film 206 with the gate insulating film 212 provided therebetween. Here, the pair of electrodes 216, the oxide semiconductor film 206, the gate insulating film 212, and the gate electrode 204 are formed using methods and materials similar to those of the pair of electrodes 116, the oxide semiconductor film 106, the gate insulating film 112, and the gate electrode 104, respectively.

Although, in FIGS. 2A to 2C, the gate electrode 204 does not completely cover the oxide semiconductor film 206, the oxide semiconductor film 206 may be completely covered with the gate electrode 204 in order to prevent light from causing degradation of the oxide semiconductor film 206 and generation of an electric charge in the oxide semiconductor film 206.

Next, a method for manufacturing the transistor illustrated in FIGS. 2A to 2C will be described with reference to FIGS. 8A to 8D.

First, the base film 102 which includes the first base film 102a and the second base film 102b over the first base film 102a is formed over the substrate 100. Then, the pair of electrodes 216 is formed over the base film 102 (see FIG. 8A).

Figure 8A:
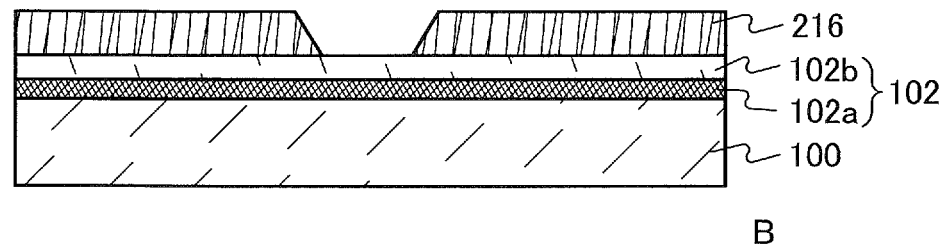
FIGS. 8A to 8D are cross-sectional views illustrating an example of a method for manufacturing a semiconductor device corresponding to the semiconductor device in FIGS. 2A to 2C.
Figure 8B:
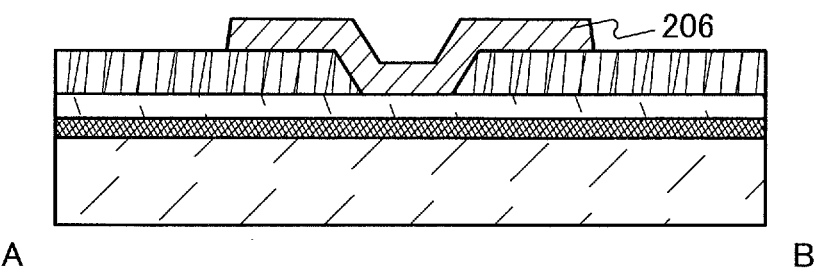

Next, the oxide semiconductor film 206 which is over the pair of electrodes 216 and is in contact with at least part of the pair of electrodes 216 is formed (see FIG. 8B). After that, heat treatment is performed at a temperature higher than 450° C. and lower than the strain point of the substrate 100, preferably higher than or equal to 500° C. and lower than or equal to 650° C. to transfer hydrogen released from the oxide semiconductor film 206 to the first base film 102a through the second base film 102b. The transferred hydrogen is captured by the first base film 102a. At this time, the hydrogen concentration in the oxide semiconductor film 206 is less than $1\times10^{19}$ cm$^{-3}$, preferably less than or equal to $5\times10^{18}$ cm$^{-3}$. The hydrogen concentration in the first base film 102a is greater than or equal to $1\times10^{19}$ cm$^{-3}$ and less than or equal to $5\times10^{20}$ cm$^{-3}$, preferably greater than or equal to $1\times10^{20}$ cm$^{-3}$ and less than or equal to $3\times10^{20}$ cm$^{-3}$. Note that in the case where a film from which oxygen is released by heat treatment is provided as the second base film 102b, oxygen can be transferred from the second base film 102b to the oxide semiconductor film 206 by the heat treatment. Thus, the interface state density at the interface between the oxide semiconductor film 206 and the second base film 102b and the oxygen vacancies in the oxide semiconductor film 206 can be reduced.

Figure 8C:
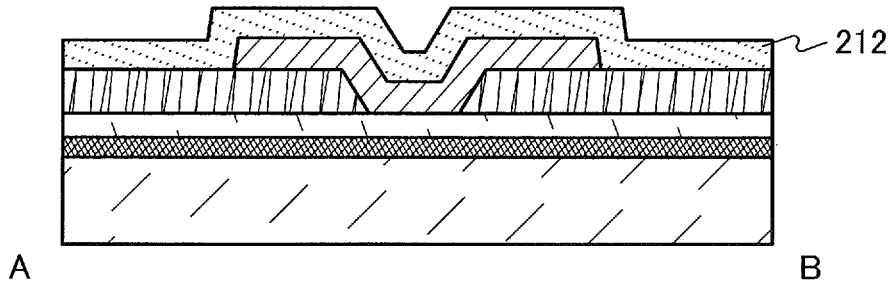

Next, the gate insulating film 212 is deposited over the oxide semiconductor film 206 and the pair of electrodes 216 (see FIG. 8C).

Figure 8D:
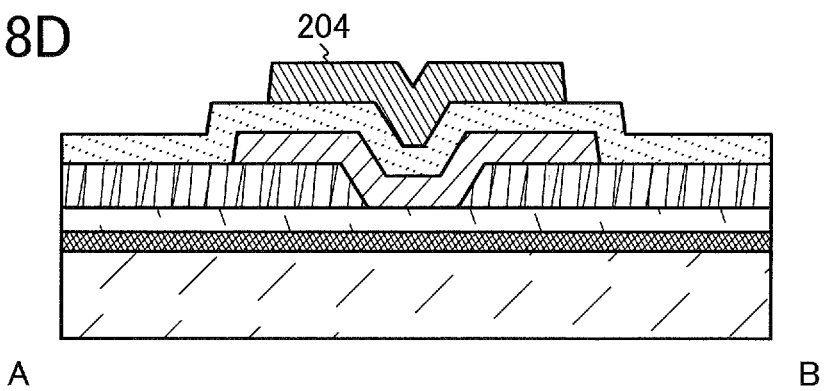
Figure 9A:
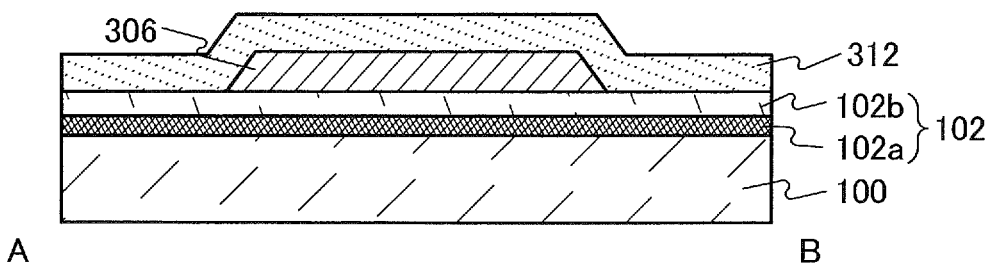
FIGS. 9A to 9D are cross-sectional views illustrating an example of a method for manufacturing a semiconductor device corresponding to the semiconductor device in FIGS. 3A to 3C.
Figure 9B:
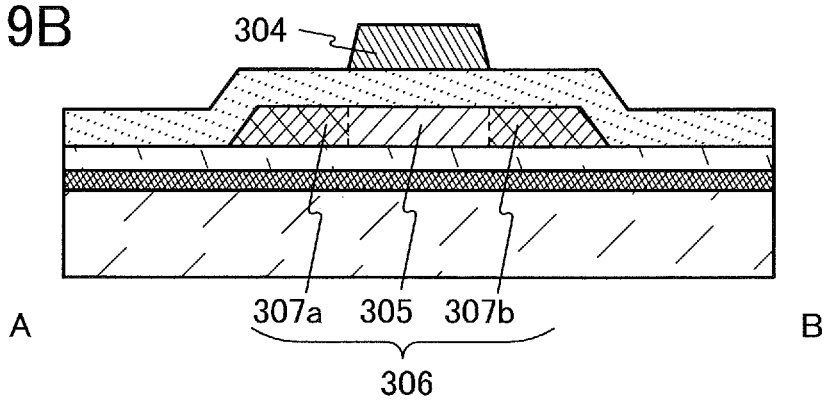
Figure 9C:
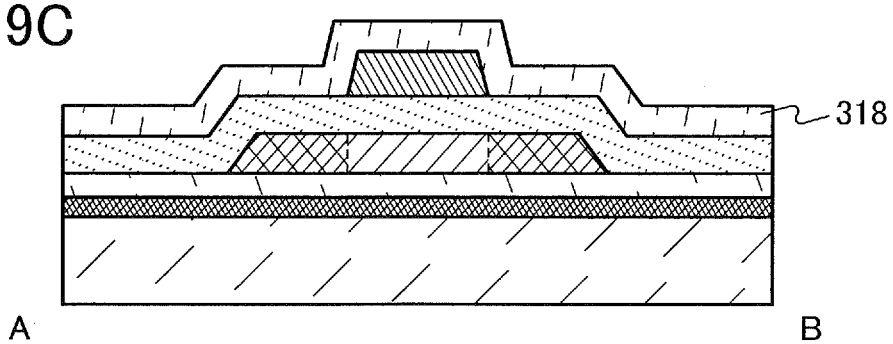
Figure 9D:
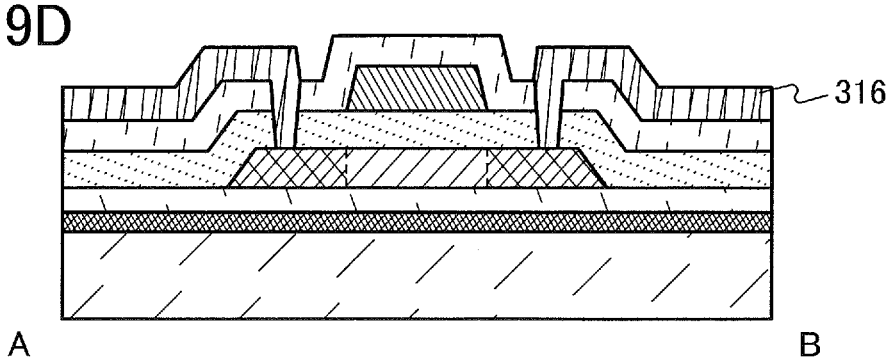

Next, the gate electrode 204 overlapping with the oxide semiconductor film 206 with the gate insulating film 212 provided therebetween is formed (see FIG. 8D).

Note that heat treatment similar to the heat treatment performed after the formation of the oxide semiconductor film 206 may be performed after the formation of the gate insulating film 212 or the gate electrode 204 instead.

As described above, hydrogen is transferred from the oxide semiconductor film 206 to the first base film 102a through the second base film 102b and the transferred hydrogen is captured by the first base film 102a, whereby the highly purified oxide semiconductor film 206 can be formed. Therefore, a highly reliable semiconductor device in which the off-state current of the transistor is significantly small and the electric characteristics are stable can be manufactured.

The threshold voltage of the transistor can be shifted to the positive direction by the operation of negative charges which are generated due to part of the hydrogen captured by the first base film 102a.

Through the process described above, the transistor illustrated in FIGS. 2A to 2C can be formed.

Next, a transistor having a structure different from that of the transistor illustrated in FIGS. 1A to 1C and FIGS. 2A to 2C will be described with reference to FIGS. 3A to 3C.

Figure 3A:
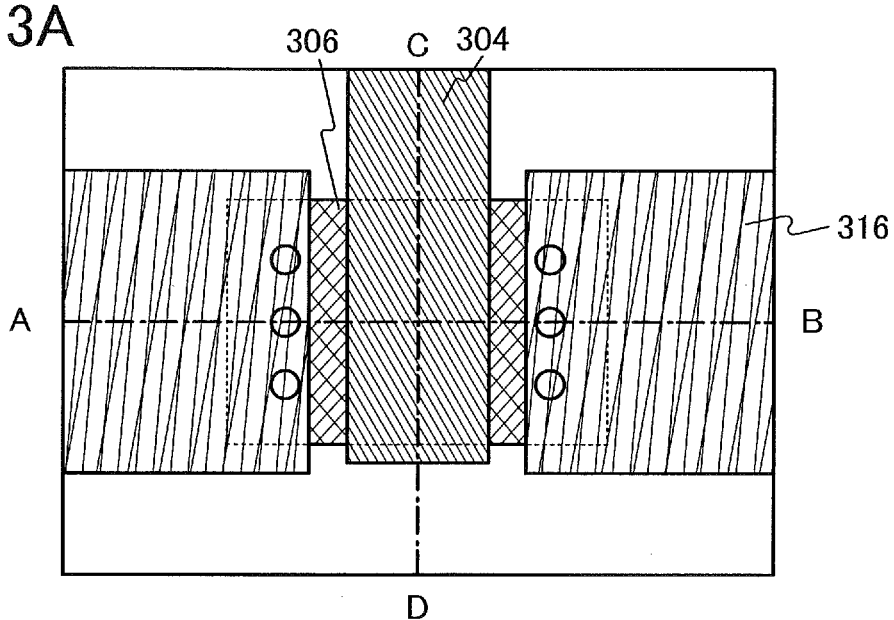
FIGS. 3A to 3C are a top view and cross-sectional views illustrating an example of a semiconductor device according to one embodiment of the present invention.
Figure 3B:
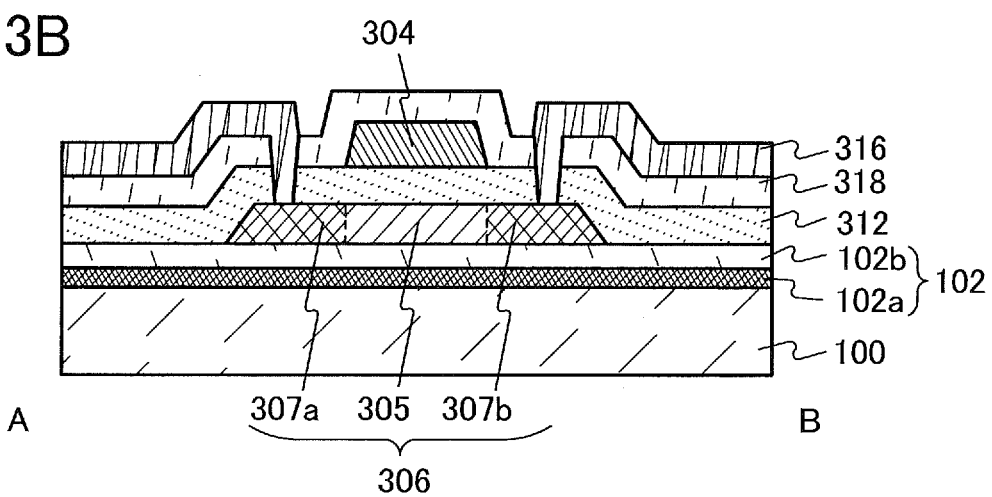
Figure 3C:
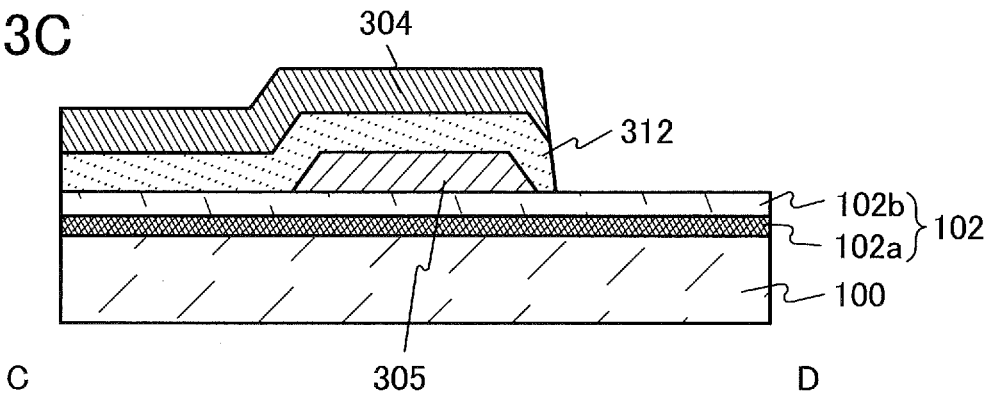

FIGS. 3A to 3C are a top view and cross-sectional views of a transistor. A cross section along the dashed-dotted line A-B in FIG. 3A and a cross section along the dashed-dotted line C-D in FIG. 3A correspond to a cross section A-B in FIG. 3B and a cross section C-D in FIG. 3C, respectively.

The cross section A-B in FIG. 3B will be described below in detail.

The transistor illustrated in FIGS. 3A to 3C includes the substrate 100, the base film 102 which is over the substrate 100 and includes the first base film 102a and the second base film 102b over the first base film 102a, an oxide semiconductor film 306 which is over the base film 102 and includes a channel region 305, a source region 307a, and a drain region 307b, a gate insulating film 312 over the oxide semiconductor film 306 and the base film 102, a gate electrode 304 overlapping with the oxide semiconductor film 306 with the gate insulating film 312 provided therebetween, a protective film 318 over the gate electrode 304 and the gate insulating film 312, and a pair of electrodes 316 which is over the protective film 318 and is in contact with the source region 307a and the drain region 307b through openings provided in the gate insulating film 312 and the protective film 318. Here, the pair of electrodes 316, the oxide semiconductor film 306, the gate electrode 304, and the gate insulating film 312 are formed using methods and materials similar to those of the pair of electrodes 116, the oxide semiconductor film 106, the gate electrode 104, and the gate insulating film 112, respectively.

Although, in FIGS. 3A to 3C, the shape of the openings provided in the gate insulating film 312 and the protective film 318 is a circle when seen from the top surface, the present invention is not limited to this shape. There is no particular limitation on the shape of the openings as long as the source region 307a and the drain region 307b are exposed through the respective openings.

The channel region 305 and the gate electrode 304 may have substantially the same shape when seen from the top surface. Note that the source region 307a and the drain region 307b include nitrogen, phosphorus, hydrogen, a rare gas, or the like.

Note that the channel region 305 is a high-resistance region, and the source region 307a and the drain region 307b are low-resistance regions.

Next, a method for manufacturing the transistor illustrated in FIGS. 3A to 3C will be described with reference to FIGS. 9A to 9D.

First, the base film 102 which includes the first base film 102a and the second base film 102b over the first base film 102a is formed over the substrate 100. Then, the oxide semiconductor film 306 is formed over the base film 102. After that, heat treatment is performed at a temperature higher than 450° C. and lower than the strain point of the substrate 100, preferably higher than or equal to 500° C. and lower than or equal to 650° C. to transfer hydrogen released from the oxide semiconductor film 306 to the first base film 102a through the second base film 102b. The transferred hydrogen is captured by the first base film 102a. At this time, the hydrogen concentration in the oxide semiconductor film 306 is less than $1 \times 10^{19}$ cm$^{-3}$, preferably less than or equal to $5 \times 10^{18}$ cm$^{-3}$. The hydrogen concentration in the first base film 102a is greater than or equal to $1 \times 10^{19}$ cm$^{-3}$ and less than or equal to $5 \times 10^{20}$ cm$^{-3}$, preferably greater than or equal to $1 \times 10^{20}$ cm$^{-3}$ and less than or equal to $3 \times 10^{20}$ cm$^{-3}$. Note that in the case where a film from which oxygen is released by heat treatment is provided as the second base film 102b, oxygen can be transferred from the second base film 102b to the oxide semiconductor film 306 by the heat treatment. Thus, the interface state density at the interface between the oxide semiconductor film 306 and the second base film 102b and the oxygen vacancies in the oxide semiconductor film 306 can be reduced. Then, the gate insulating film 312 is formed over the oxide semiconductor film 306 and the base film 102 (see FIG. 9A).

Next, the gate electrode 304 overlapping with the oxide semiconductor film 306 with the gate insulating film 312 provided therebetween is formed. Then, with the use of the gate electrode 304 as a mask, nitrogen, phosphorus, hydrogen, or a rare gas is added to a part of the oxide semiconductor film 306. The addition or heat treatment in addition to the addition is performed, thereby by reducing the resistance of a region of the oxide semiconductor film 306, which does not overlap with the gate electrode 304. Accordingly, the channel region 305, the source region 307a, and the drain region 307b are formed (see FIG. 9B). Note that the heat treatment performed here can be performed after the formation of the oxide semiconductor film 306 instead.

Next, the protective film 318 is formed over the gate insulating film 312 and the gate electrode 304, and the respective openings through which each of the source region 307a and the drain region 307b are exposed are formed in the gate insulating film 312 and the protective film 318. Then, the pair of electrodes 316 which is in contact with the oxide semiconductor film 306 is formed (see FIG. 9D). Note that heat treatment similar to the heat treatment performed after the formation of the oxide semiconductor film 306 and the heat treatment performed to form the source region 307a and the drain region 307b may be performed after the formation of the protective film 318 or the pair of electrodes 316 instead.

As described above, hydrogen is transferred from the oxide semiconductor film 306 to the first base film 102a through the second base film 102b and the transferred hydrogen is captured by the first base film 102a, whereby the highly purified oxide semiconductor film 306 can be formed. Therefore, a highly reliable semiconductor device in which the off-state current of the transistor is significantly small and the electric characteristics are stable can be manufactured.

The threshold voltage of the transistor can be shifted to the positive direction by the operation of negative charges which are generated due to part of the hydrogen captured by the first base film 102a.

Through the process described above, the transistor illustrated in FIGS. 3A to 3C can be formed.

Next, a transistor having a structure different from that of the transistor illustrated in FIGS. 1A to 1C, FIGS. 2A to 2C, and FIGS. 3A to 3C will be described with reference to FIGS. 4A to 4C.

Figure 4A:
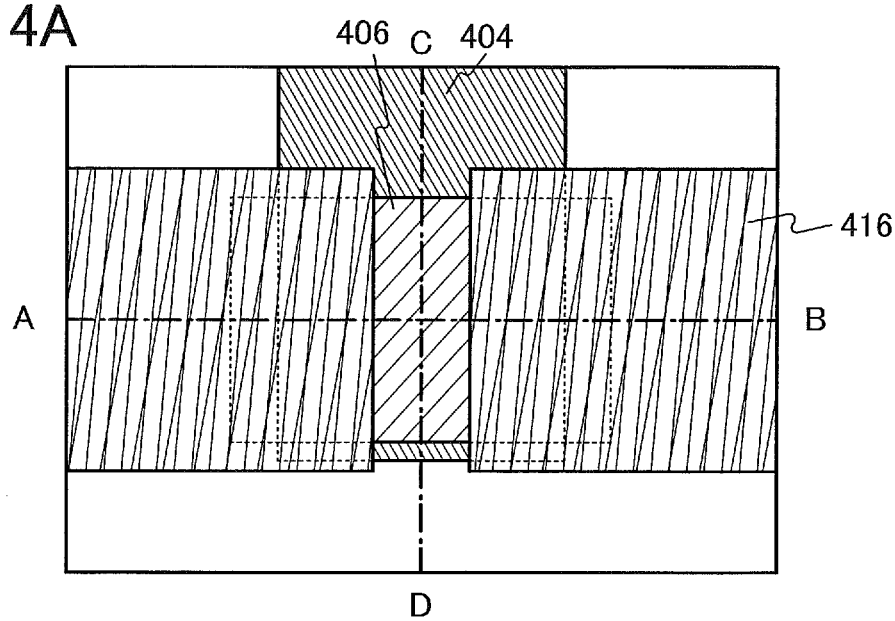
FIGS. 4A to 4C are a top view and cross-sectional views illustrating an example of a semiconductor device according to one embodiment of the present invention.
Figure 4B:
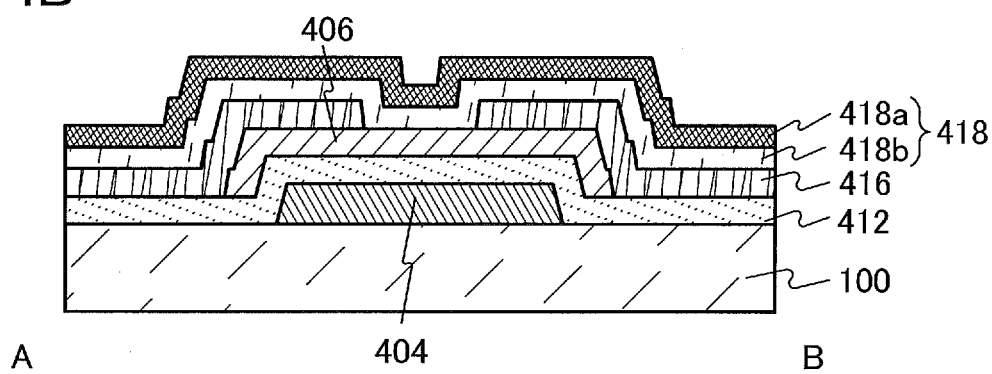
Figure 4C:
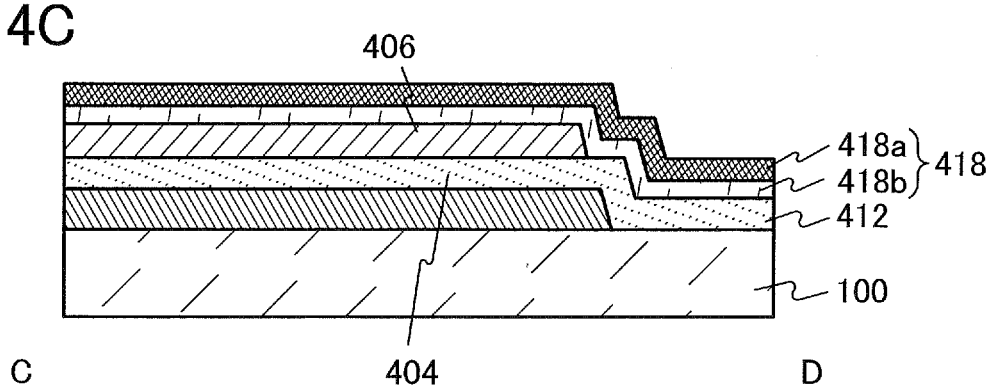

FIGS. 4A to 4C are a top view and cross-sectional views of a transistor. A cross section along the dashed-dotted line A-B in FIG. 4A and a cross section along the dashed-dotted line C-D in FIG. 4A correspond to a cross section A-B in FIG. 4B and a cross section C-D in FIG. 4C, respectively.

The cross section A-B in FIG. 4B will be described below in detail.

The transistor illustrated in FIGS. 4A to 4C includes the substrate 100, a gate electrode 404 over the substrate 100, a gate insulating film 412 covering the gate electrode 404, an oxide semiconductor film 406 overlapping with the gate electrode 404 with the gate insulating film 412 provided therebetween, a pair of electrodes 416 which is over the oxide semiconductor film 406 and is in contact with at least part of the oxide semiconductor film 406, and a protective film 418 which is over the oxide semiconductor film 406 and the pair of electrodes 416 and includes a second protective film 418b and a first protective film 418a over the second protective film 418b. Here, the gate electrode 404, the gate insulating film 412, the oxide semiconductor film 406, and the pair of electrodes 416 are formed using methods and materials similar to those of the gate electrode 104, the gate insulating film 112, the oxide semiconductor film 106, and the pair of electrodes 116, respectively.

Note that the first protective film 418a and the second protective film 418b are formed using methods and materials similar to those of the first base film 102a and the second base film 102b, respectively.

Although, in FIGS. 4A to 4C, the gate electrode 404 does not completely cover the oxide semiconductor film 406, the oxide semiconductor film 406 may be completely covered with the gate electrode 404 in order to prevent light from causing degradation of the oxide semiconductor film 406 and generation of an electric charge in the oxide semiconductor film 406.

Next, a method for manufacturing the transistor illustrated in FIGS. 4A to 4C will be described with reference to FIGS. 10A to 10D.

First, the gate electrode 404 is formed over the substrate 100. Next, the gate insulating film 412 is deposited so as to cover the gate electrode 404 (see FIG. 10A).

Figure 10A:
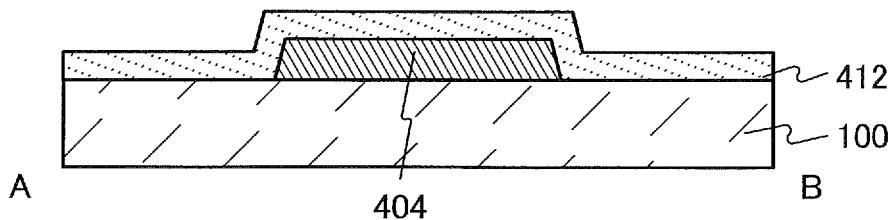
FIGS. 10A to 10D are cross-sectional views illustrating an example of a method for manufacturing a semiconductor device corresponding to the semiconductor device in FIGS. 4A to 4C.
Figure 10B:
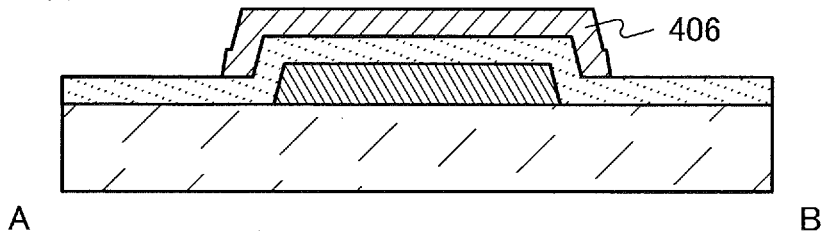

Next, the oxide semiconductor film 406 overlapping with the gate electrode 404 with the gate insulating film 412 provided therebetween is formed (see FIG. 10B).

Figure 10C:
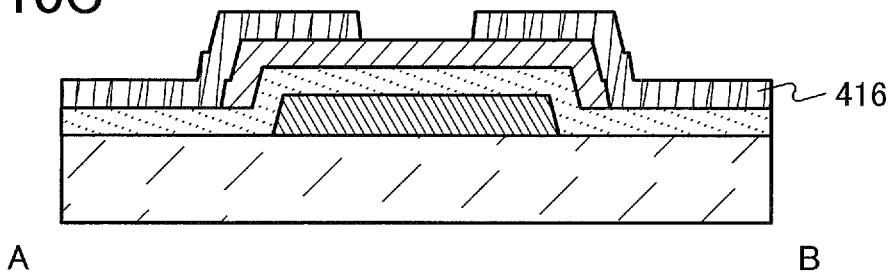

Next, the pair of electrodes 416 which is over the oxide semiconductor film 406 and is in contact with at least part of the oxide semiconductor film 406 is formed (see FIG. 10C).

Figure 10D:
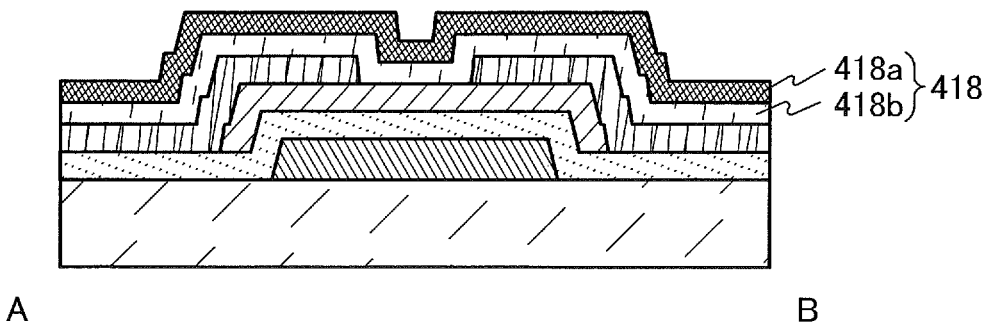

Next, the protective film 418 including the second protective film 418b and the first protective film 418a over the second protective film 418b is formed over the oxide semiconductor film 406 and the pair of electrodes 416 (see FIG. 10D). After that, heat treatment is performed at a temperature higher than 450° C. and lower than the strain point of the substrate 100, preferably higher than or equal to 500° C. and lower than or equal to 650° C. to transfer hydrogen released from the oxide semiconductor film 406 to the first protective film 418a through the second protective film 418b. The transferred hydrogen is captured by the first protective film 418a. At this time, the hydrogen concentration in the oxide semiconductor film 406 is less than $1 \times 10^{19}$ cm$^{-3}$, preferably less than or equal to $5 \times 10^{18}$ cm$^{-3}$. The hydrogen concentration in the first protective film 418a is greater than or equal to $1 \times 10^{19}$ cm$^{-3}$ and less than or equal to $5 \times 10^{20}$ cm$^{-3}$, preferably greater than or equal to $1 \times 10^{20}$ cm$^{-3}$ and less than or equal to $3 \times 10^{20}$ cm$^{-3}$. Note that in the case where a film from which oxygen is released by heat treatment is provided as the second protective film 418b, oxygen can be transferred from the second protective film 418b to the oxide semiconductor film 406 by the heat treatment. Thus, the interface state density at the interface between the oxide semiconductor film 406 and the second protective film 418b and the oxygen vacancies in the oxide semiconductor film 406 can be reduced.

As described above, hydrogen is transferred from the oxide semiconductor film 406 to the first protective film 418a through the second protective film 418b and the transferred hydrogen is captured by the first protective film 418a, whereby the highly purified oxide semiconductor film 406 can be formed. Therefore, a highly reliable semiconductor device in which the off-state current of the transistor is significantly small and the electric characteristics are stable can be manufactured.

The threshold voltage of the transistor can be shifted to the positive direction by the operation of negative charges which are generated due to part of the hydrogen captured by the first protective film 418a.

Through the process described above, the transistor illustrated in FIGS. 4A to 4C can be formed.

Next, a transistor having a structure different from that of the transistor illustrated in FIGS. 1A to 1C, FIGS. 2A to 2C, FIGS. 3A to 3C, and FIGS. 4A to 4C will be described with reference to FIGS. 5A to 5C.

Figure 5A:
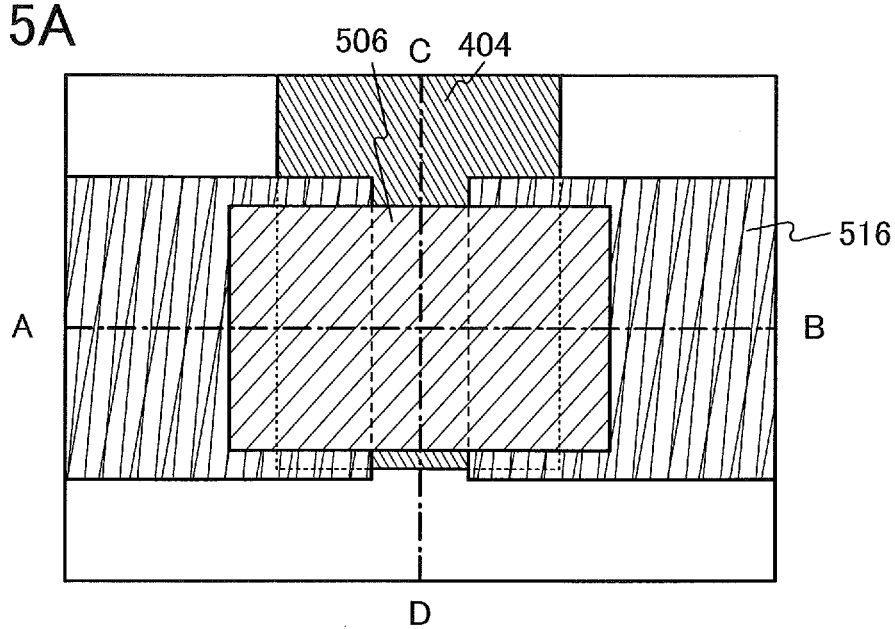
FIGS. 5A to 5C are a top view and cross-sectional views illustrating an example of a semiconductor device according to one embodiment of the present invention.
Figure 5B:
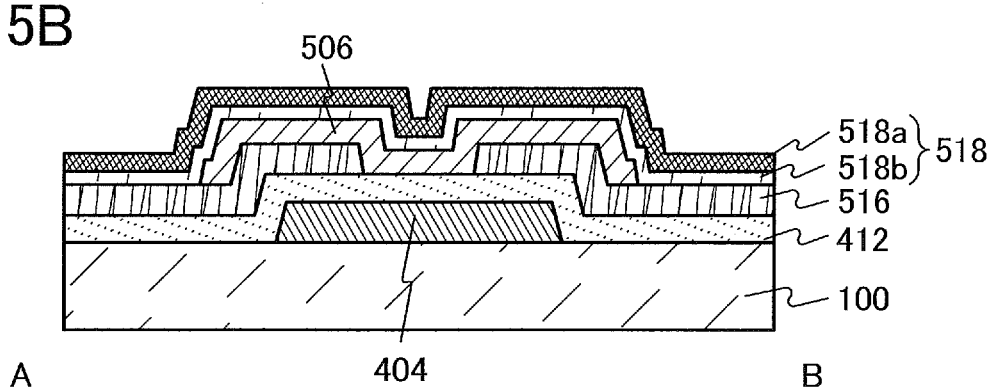
Figure 5C:
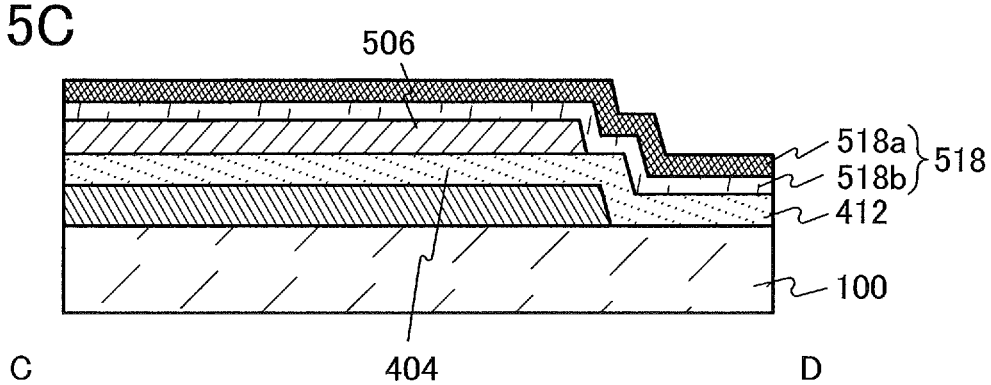

FIGS. 5A to 5C are a top view and cross-sectional views of a transistor. A cross section along the dashed-dotted line A-B in FIG. 5A and a cross section along the dashed-dotted line C-D in FIG. 5A correspond to a cross section A-B in FIG. 5B and a cross section C-D in FIG. 5C, respectively.

The cross section A-B in FIG. 5B will be described below in detail.

The transistor illustrated in FIGS. 5A to 5C includes the substrate 100, the gate electrode 404 over the substrate 100, the gate insulating film 412 covering the gate electrode 404, a pair of electrodes 516 over the gate insulating film 412, an oxide semiconductor film 506 which is in contact with at least part of the pair of electrodes 516 and overlaps with the gate electrode 404 with the gate insulating film 412 provided therebetween, and a protective film 518 which is over the oxide semiconductor film 506 and the pair of electrodes 516 and includes a second protective film 518b and a first protective film 518a over the second protective film 518b. Here, the oxide semiconductor film 506, the pair of electrodes 516, and the protective film 518 are formed using methods and materials similar to those of the oxide semiconductor film 106, the pair of electrodes 116, and the protective film 418, respectively.

Although, in FIGS. 5A to 5C, the gate electrode 404 does not completely cover the oxide semiconductor film 506, the oxide semiconductor film 506 may be completely covered with the gate electrode 404 in order to prevent light from causing degradation of the oxide semiconductor film 506 and generation of an electric charge in the oxide semiconductor film 506.

Figure 11A:
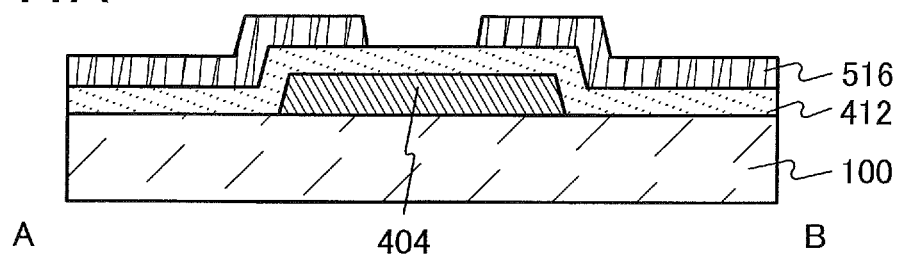
FIGS. 11A to 11C are cross-sectional views illustrating an example of a method for manufacturing a semiconductor device corresponding to the semiconductor device in FIGS. 5A to 5C.

Next, a method for manufacturing the transistor illustrated in FIGS. 5A to 5C will be described with reference to FIGS. 11A to 11C.

First, the gate electrode 404 is formed over the substrate 100. Next, the gate insulating film 412 is deposited so as to cover the gate electrode 404. Then, the pair of electrodes 516 is formed over the gate insulating film 412 (see FIG. 11A).

Figure 11B:
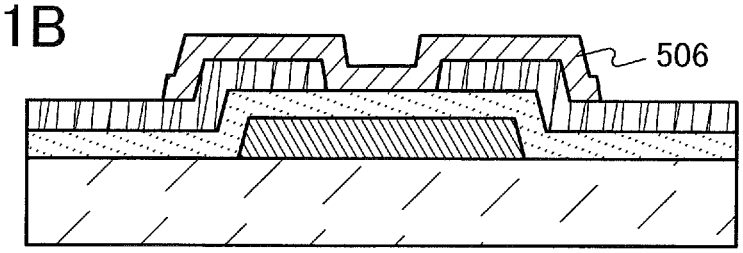

Next, the oxide semiconductor film 506 which overlaps with the gate electrode 404 with the gate insulating film 412 provided therebetween and is in contact with at least part of the pair of electrodes 516 is formed (see FIG. 11B).

Figure 11C:
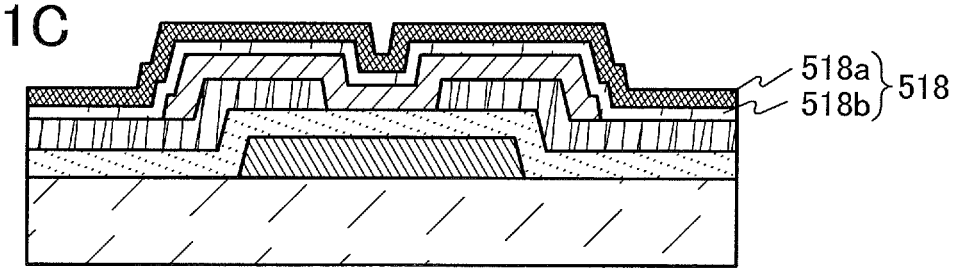

Next, the protective film 518 including the second protective film 518b and the first protective film 518a over the second protective film 518b is formed over the oxide semiconductor film 506 and the pair of electrodes 516 (see FIG. 11C). After that, heat treatment is performed at a temperature higher than 450° C. and lower than the strain point of the substrate 100, preferably higher than or equal to 500° C. and lower than or equal to 650° C. to transfer hydrogen released from the oxide semiconductor film 506 to the first protective film 518a through the second protective film 518b. The transferred hydrogen is captured by the first protective film 518a. At this time, the hydrogen concentration in the oxide semiconductor film 506 is less than $1\times10^{19}$ cm$^{-3}$, preferably less than or equal to $5\times10^{18}$ cm$^{-3}$. The hydrogen concentration in the first protective film 518a is greater than or equal to $1\times10^{19}$ cm$^{-3}$ and less than or equal to $5\times10^{20}$ cm$^{-3}$, preferably greater than or equal to $1\times10^{20}$ cm$^{-3}$ and less than or equal to $3\times10^{20}$ cm$^{-3}$. Note that in the case where a film from which oxygen is released by heat treatment is provided as the second protective film 518b, oxygen can be transferred from the second protective film 518b to the oxide semiconductor film 506 by the heat treatment. Thus, the interface state density at the interface between the oxide semiconductor film 506 and the second protective film 518b and the oxygen vacancies in the oxide semiconductor film 506 can be reduced.

As described above, hydrogen is transferred from the oxide semiconductor film 506 to the first protective film 518a through the second protective film 518b and the transferred hydrogen is captured by the first protective film 518a, whereby the highly purified oxide semiconductor film 506 can be formed. Therefore, a highly reliable semiconductor device in which the off-state current of the transistor is significantly small and the electric characteristics are stable can be manufactured.

The threshold voltage of the transistor can be shifted to the positive direction by the operation of negative charges which are generated due to part of the hydrogen captured by the first protective film 518a.

Through the process described above, the transistor illustrated in FIGS. 5A to 5C can be formed.

Next, a transistor having a structure different from that of the transistor illustrated in FIGS. 1A to 1C, FIGS. 2A to 2C, FIGS. 3A to 3C, FIGS. 4A to 4C, and FIGS. 5A to 5C will be described with reference to FIGS. 6A to 6C.

Figure 6A:
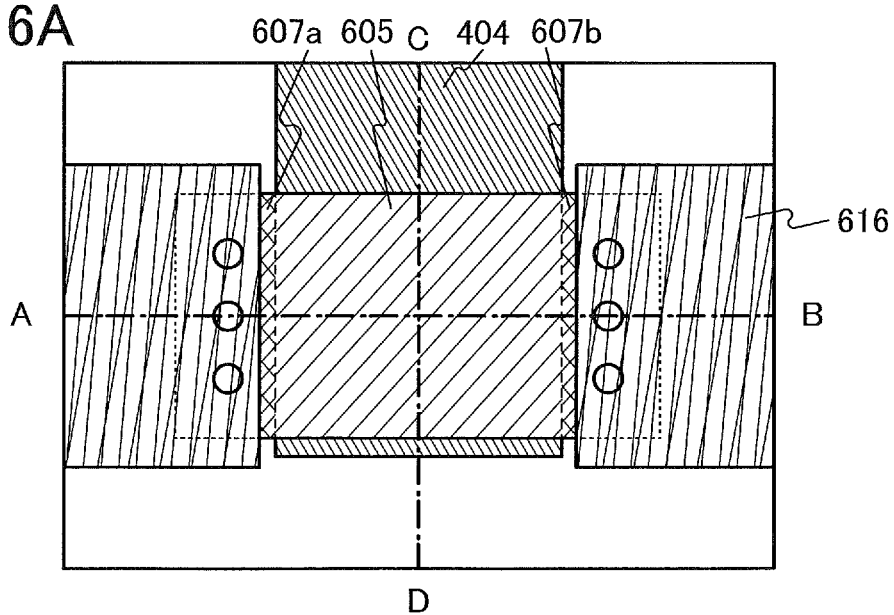
FIGS. 6A to 6C are a top view and cross-sectional views illustrating an example of a semiconductor device according to one embodiment of the present invention.
Figure 6B:
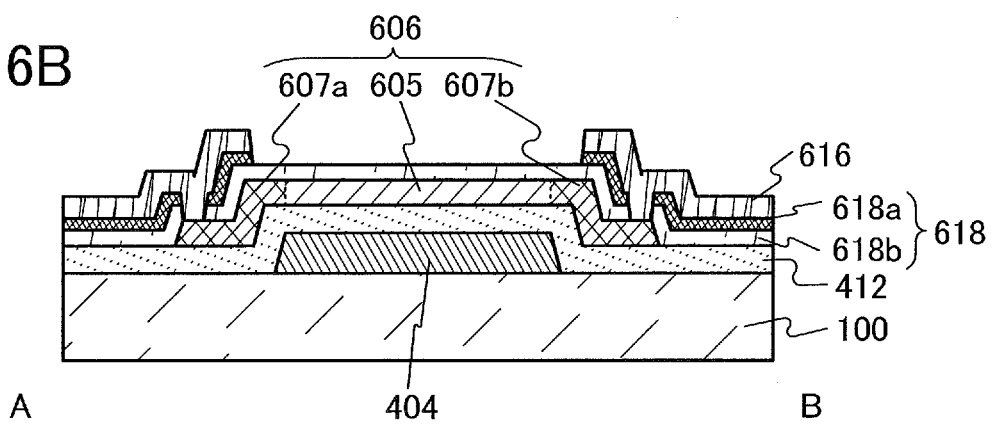
Figure 6C:
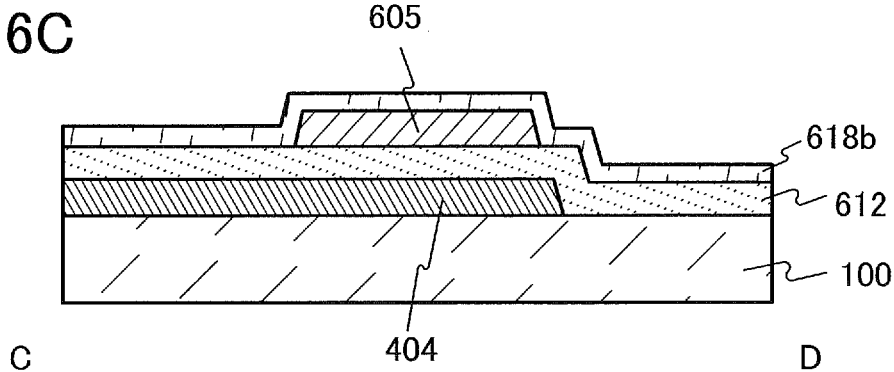

FIGS. 6A to 6C are a top view and cross-sectional views of a transistor. A cross section along the dashed-dotted line A-B in FIG. 6A and a cross section along the dashed-dotted line C-D in FIG. 6A correspond to a cross section A-B in FIG. 6B and a cross section C-D in FIG. 6C, respectively.

The cross section A-B in FIG. 6B will be described below in detail.

The transistor illustrated in FIGS. 6A to 6C includes the substrate 100, the gate electrode 404 over the substrate 100, the gate insulating film 412 covering the gate electrode 404, an oxide semiconductor film 606 which is over the gate electrode 404 with the gate insulating film 412 provided therebetween and includes a channel region 605, a source region 607a, and a drain region 607b, a protective film 618 which is over the gate insulating film 412 and the oxide semiconductor film 606 and includes a second protective film 618b and a first protective film 618a over the second protective film 618b, and a pair of electrodes 616 which is over the protective film 618 and is in contact with the source region 607a and the drain region 607b each through an opening provided in the protective film 618. Here, the pair of electrodes 616, the oxide semiconductor film 606, and the protective film 618 are formed using methods and materials similar to those of the pair of electrodes 116, the oxide semiconductor film 106, and the protective film 418, respectively.

Although, in FIGS. 6A to 6C, there seems to be a region where the first protective film 618a is not formed over the second protective film 618b, the present invention is not limited to this structure. For example, the first protective film 618a may be formed over the entire surface of the second protective film 618b.

Although, in FIGS. 6A to 6C, the gate electrode 404 and the channel region 605 have substantially the same shape seen from the top surface, the present invention is not limited to this shape. The gate electrode 404 and the channel region 605 may have different shapes from each other.

Note that the source region 607a and the drain region 607b include nitrogen, phosphorus, hydrogen, a rare gas, or the like.

Note that the channel region 605 is a high-resistance region, and the source region 607a and the drain region 607b are low-resistance regions.

Next, a method for manufacturing the transistor illustrated in FIGS. 6A to 6C will be described with reference to FIGS. 12A to 12D.

First, the gate electrode 404 is formed over the substrate 100. Next, the gate insulating film 412 is deposited so as to cover the gate electrode 404. Then, the oxide semiconductor film 606 overlapping with the gate electrode 404 with the gate insulating film 412 provided therebetween is formed (see FIG. 12A).

Next, with the use of a resist mask or the like as a mask, nitrogen, phosphorus, hydrogen, or a rare gas is added to a part of the oxide semiconductor film 606. The addition or heat treatment in addition to the addition is performed, thereby reducing the resistance of a region of the oxide semiconductor film 606, which does not overlap with the gate electrode 404. Accordingly, the channel region 605, the source region 607a, and the drain region 607b are formed (see FIG. 12B). Note that the resist mask or the like may be formed by a back exposure technique with the use of the gate electrode 404 as a mask. In that case, an area where the source region 607a overlaps with the gate electrode 404 and an area where the drain region 607b overlaps with the gate electrode 404 can be reduced; thus, the parasitic capacitance is reduced. Accordingly, the operation speed of the transistor can be increased. In addition, the number of photomasks used for forming the resist mask can be reduced, whereby the manufacturing cost for the transistor can be reduced, which is preferable.

Figure 12A:
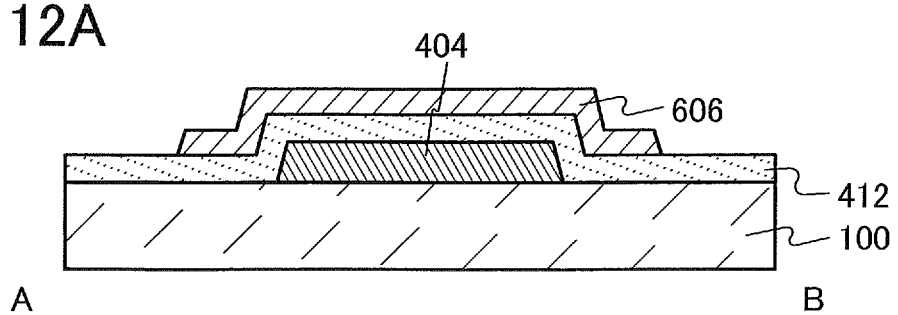
FIGS. 12A to 12D are cross-sectional views illustrating an example of a method for manufacturing a semiconductor device corresponding to the semiconductor device in FIGS. 6A to 6C.
Figure 12B:
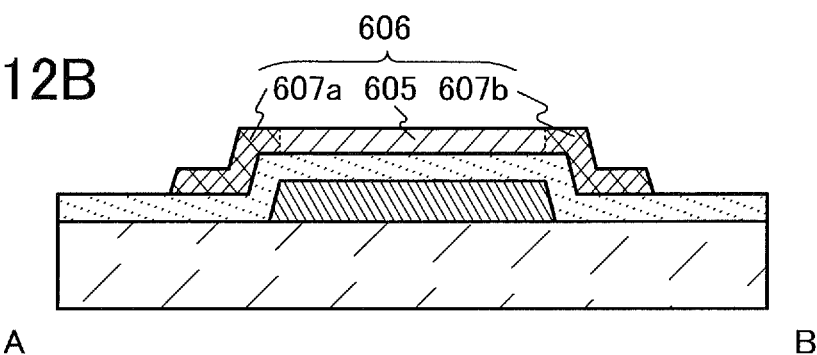
Figure 12C:
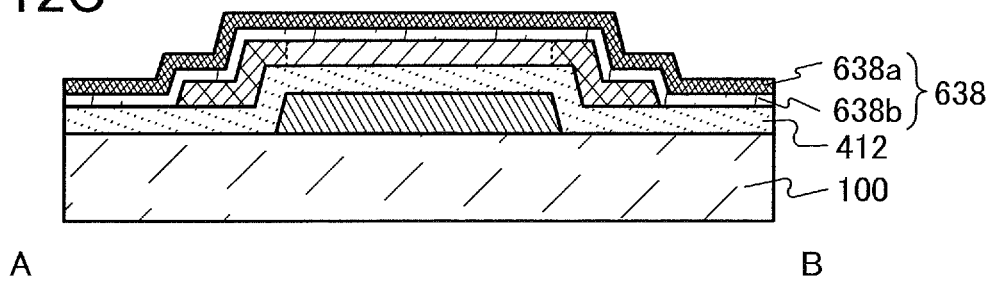

Next, a protective film 638 is formed by depositing a stack of a second protective film 638b and a first protective film 638a in this order over the oxide semiconductor film 606 and the gate insulating film 412 (see FIG. 12C). After that, heat treatment is performed at a temperature higher than 450° C. and lower than the strain point of the substrate 100, preferably higher than or equal to 500° C. and lower than or equal to 650° C. to transfer hydrogen released from the oxide semiconductor film 606 to the first protective film 638a through the second protective film 638b. The transferred hydrogen is captured by the first protective film 638a. At this time, the hydrogen concentration in the oxide semiconductor film 606 is less than $1\times10^{19}$ cm$^{-3}$, preferably less than or equal to $5\times10^{18}$ cm$^{-3}$. The hydrogen concentration in the first protective film 638a is greater than or equal to $1\times10^{19}$ cm$^{-3}$ and less than or equal to $5\times10^{20}$ cm$^{-3}$, preferably greater than or equal to $1\times10^{20}$ cm$^{-3}$ and less than or equal to $3\times10^{20}$ cm$^{-3}$. Note that in the case where a film from which oxygen is released by heat treatment is provided as the second protective film 638b, oxygen can be transferred from the second protective film 638b to the oxide semiconductor film 606 by the heat treatment. Thus, the interface state density at the interface between the oxide semiconductor film 606 and the second protective film 638b and the oxygen vacancies in the oxide semiconductor film 606 can be reduced.

Figure 12D:
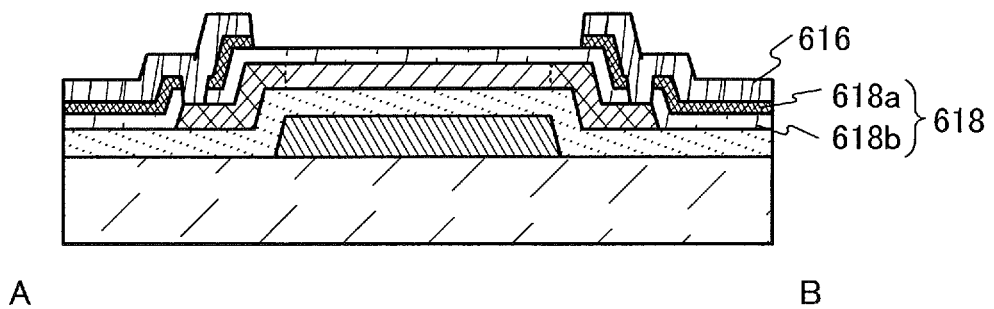

Next, the protective film 618 including the second protective film 618b and the first protective film 618a over the second protective film 618b and the pair of electrodes 616 which is in contact with the oxide semiconductor film 606 are formed in a manner such that the respective openings through which each of the source region 607a and the drain region 607b are exposed are formed in the protective film 638, a conductive film is deposited, and then the conductive film and the first protective film 638a are processed (see FIG. 12D). Although the first protective film 638a is processed at the same time as formation of the pair of electrodes 616 by processing the conductive film, without limitation to this structure, the first protective film 638a is not necessarily processed.

Through the process described above, the transistor illustrated in FIGS. 6A to 6C can be formed.

This embodiment can be implemented in appropriate combination with the other embodiments.

Embodiment 2

In this embodiment, a liquid crystal display device manufactured using the transistor described in Embodiment 1 will be described. Note that although an example in which one embodiment of the present invention is applied to the liquid crystal display device is described in this embodiment, the present invention is not limited to this embodiment. For example, application of one embodiment of the present invention to an electroluminescence (EL) display device which is one of light-emitting devices is readily conceived by those skilled in the art.

Figure 13:
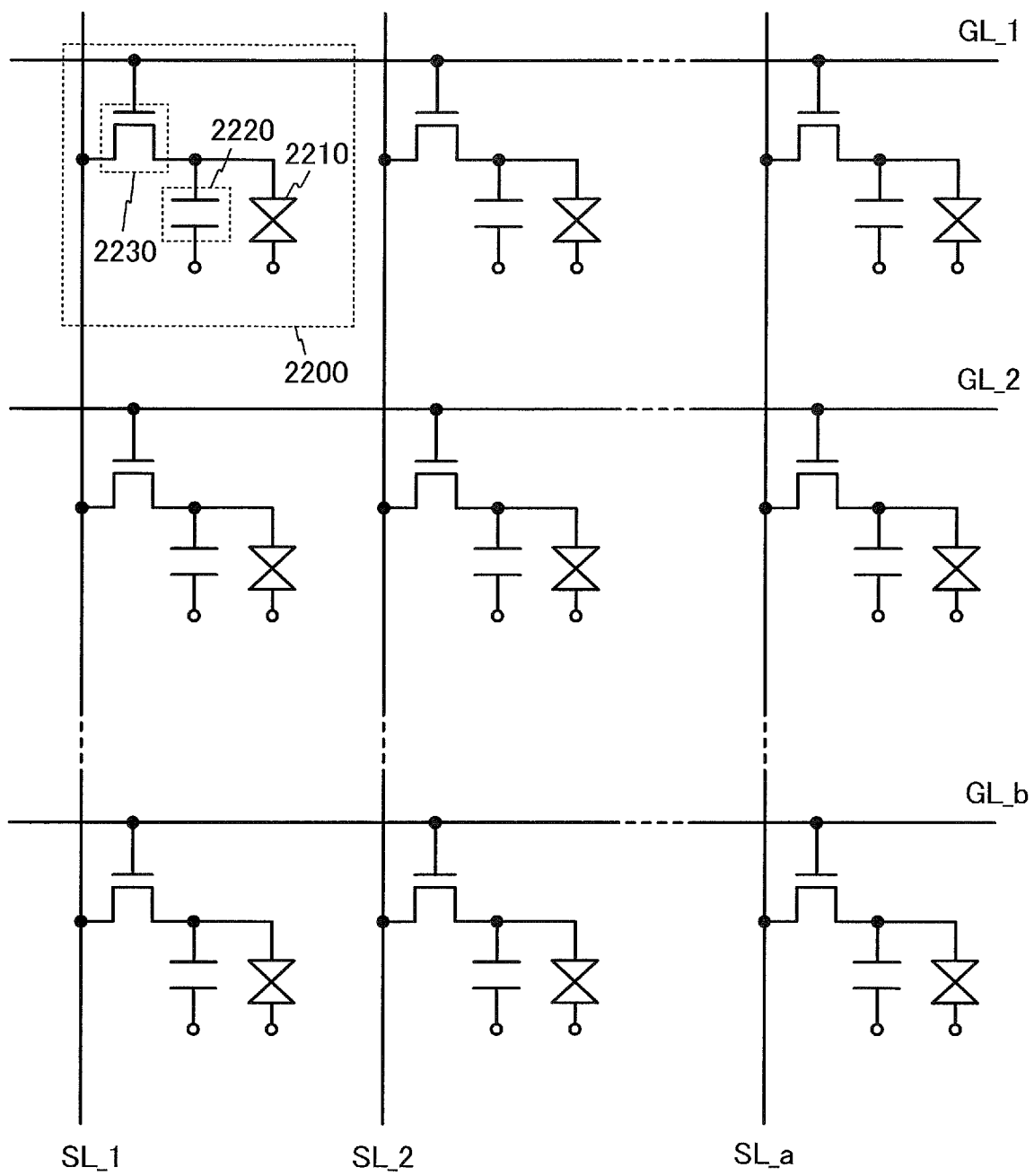
FIG. 13 is a circuit diagram illustrating an example of a liquid crystal display device according to one embodiment of the present invention.

FIG. 13 is a circuit diagram of an active matrix liquid crystal display device. The liquid crystal display device includes source lines SL_1 to SL_a, gate lines GL_1 to GL_b, and a plurality of pixels 2200. Each pixel 2200 includes a transistor 2230, a capacitor 2220, and a liquid crystal element 2210. The plurality of pixels 2200 with such a configuration forms a pixel portion of the liquid crystal display device. In the case where the source line or the gate line is simply mentioned, it is denoted as the source line SL or the gate line GL in some cases.

The transistor described in Embodiment 1, which is one embodiment of the present invention, is used as the transistor 2230. Since the transistor described in Embodiment 1 is a transistor including an oxide semiconductor having favorable electric characteristics, a liquid crystal display device with high display quality and low power consumption can be obtained.

The gate line GL is connected to a gate of the transistor 2230, the source line SL is connected to a source of the transistor 2230, and a drain of the transistor 2230 is connected to one of capacitor electrodes of the capacitor 2220 and one of pixel electrodes of the liquid crystal element 2210. The other of the capacitor electrodes of the capacitor 2220 and the other of the pixel electrodes of the liquid crystal element 2210 are each connected to a common electrode. Note that the common electrode may be formed using the same material in the same layer as the gate line GL.

Further, the gate line GL is connected to a gate driver circuit. The gate driver circuit may include the transistor described in Embodiment 1.

The source line SL is connected to a source driver circuit. The source driver circuit may include the transistor described in Embodiment 1.

One of or both of the gate driver circuit and the source driver circuit may be formed over a separately prepared substrate and connected by a connection method such as a chip on glass (COG) method, a wire bonding method, or a tape automated bonding (TAB) method.

Since a transistor is easily broken by static electricity or the like, a protection circuit is preferably provided. The protection circuit is preferably formed using a nonlinear element.

When a voltage that is higher than or equal to the threshold voltage of the transistor 2230 is applied to the gate line GL, an electric charge supplied from the source line SL flows as a drain current of the transistor 2230 and is accumulated in the capacitor 2220. After charging for one row, the transistors 2230 in the row are turned off and voltage application from the source line SL stops; however, a voltage which is needed can be kept by the electric charges accumulated in the capacitors 2220. Then, charging of the capacitors 2220 in the next row starts. In this manner, charging for the first row to the b-th row is carried out. A drain current is a current that flows from a source to a drain through a channel in a transistor. The drain current flows when a gate voltage is higher than the threshold voltage.

In the case where a transistor having a small off-state current is used as the transistor 2230, the period for which the voltage is kept can be lengthened. By this effect, the display rewriting frequency can be reduced in the case where an image with little motion (including a still image) is displayed; accordingly, further reduction in power consumption is possible. Further, the capacitance of the capacitor 2220 can be further reduced; accordingly, power consumed for charging can be reduced.

As described above, according to one embodiment of the present invention, a liquid crystal display device with high display quality and low power consumption can be provided.

This embodiment can be implemented in appropriate combination with the other embodiments.

Embodiment 3

In this embodiment, an example of manufacturing a semiconductor memory device using the transistor described in Embodiment 1 will be described.

Typical examples of a volatile semiconductor memory device include a dynamic random access memory (DRAM) which stores data by selecting a transistor included in a memory element and accumulating electric charges in a capacitor and a static random access memory (SRAM) which holds stored data using a circuit such as a flip-flop.

Typical examples of a nonvolatile semiconductor memory device include a flash memory which has a node between a gate electrode and a channel region of a transistor and stores data by holding an electric charge in the node.

The transistor described in Embodiment 1 can be applied to some of transistors included in the above-described semiconductor memory device.

First, a memory cell included in a semiconductor memory device to which the transistor described in Embodiment 1 is applied will be described with reference to FIGS. 14A and 14B.

Figure 14A:
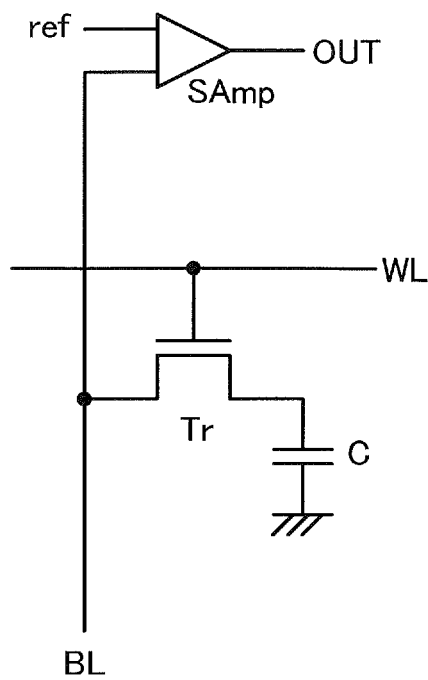
FIG. 14A is a circuit diagram illustrating an example of a semiconductor memory device according to one embodiment of the present invention.

A memory cell includes a bit line BL, a word line WL, a sense amplifier SAmp, a transistor Tr, and a capacitor C (see FIG. 14A).

Figure 14B:
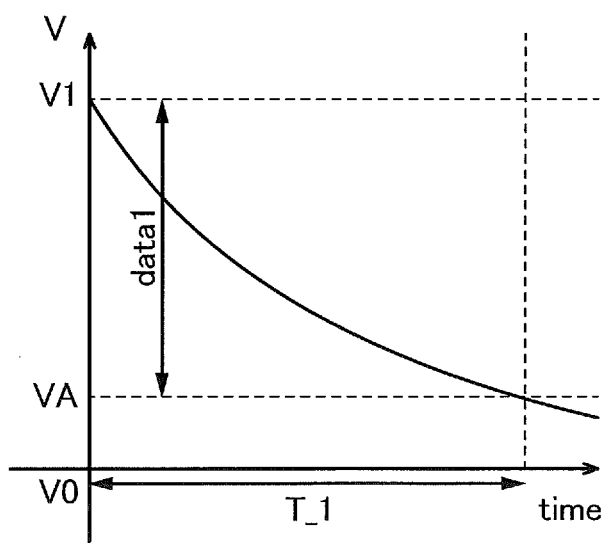
FIG. 14B is a graph showing electric characteristics thereof.

Note that it is known that the voltage held in the capacitor C is gradually decreased with time as shown in FIG. 14B owing to the off-state current of the transistor Tr. A voltage originally charged from V0 to V1 is decreased with time to VA that is a limit for reading out data 1. This period is called a holding period T_1. In the case of a two-level memory cell, refresh operation needs to be performed within the holding period T_1.

Here, when the transistor described in Embodiment 1 is used as the transistor Tr, the holding period T_1 can be increased because off-state current is small. That is, frequency of the refresh operation can be reduced; thus, power consumption can be reduced. For example, in the case where a memory cell is formed using a transistor including an oxide semiconductor film in which an off-state current is less than or equal to $1\times10^{-21}$ A, preferably less than or equal to $1\times10^{-24}$ A, data can be held for several days to several tens of years without supply of electric power.

As described above, according to one embodiment of the present invention, a semiconductor memory device with high reliability and low power consumption can be provided.

Next, an example of a memory cell included in a semiconductor memory device to which the transistor described in Embodiment 1 is applied, which is different from the memory cell in FIGS. 14A and 14B, will be described with reference to FIGS. 15A and 15B.

Figure 15A:
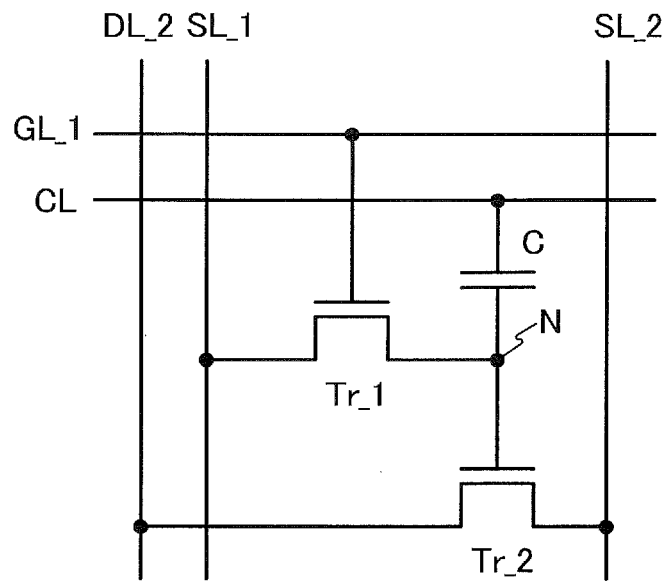
FIG. 15A is a circuit diagram illustrating an example of a semiconductor memory device according to one embodiment of the present invention.
Figure 15B:
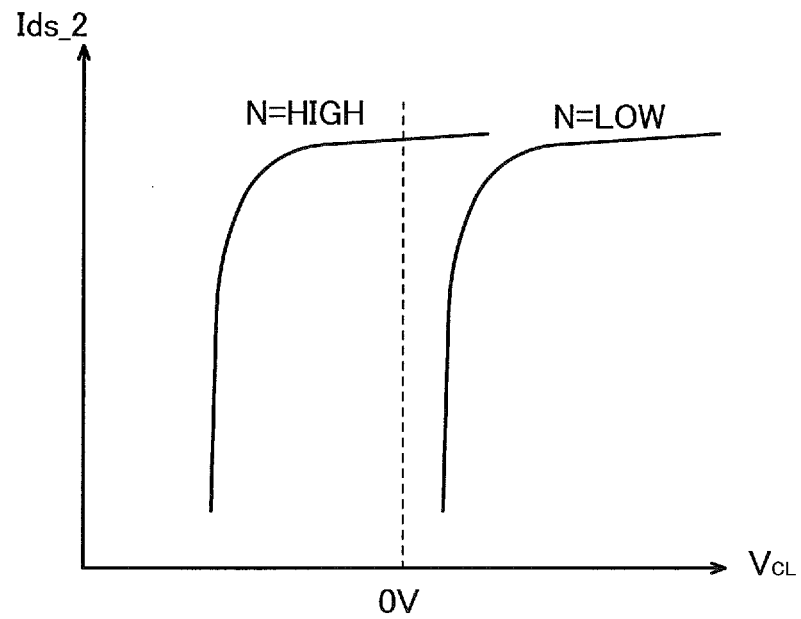
FIG. 15B is a graph showing electric characteristics thereof.

FIG. 15A is a circuit diagram of a memory cell. The memory cell includes a transistor Tr_1, a gate line GL_1 connected to a gate of the transistor Tr_1, a source line SL_1 connected to a source of the transistor Tr_1, a transistor Tr_2, a source line SL_2 connected to a source of the transistor Tr_2, a drain line DL_2 connected to a drain of the transistor Tr_2, a capacitor C, a capacitor line CL connected to one terminal of the capacitor C, and a node N connected to the other terminal of the capacitor C, a drain of the transistor Tr_1, and a gate of the transistor Tr_2.

The memory cell illustrated in FIG. 15A utilizes variation in the threshold voltage of the transistor Tr_2, which depends on the potential of the node N. For example, FIG. 15B shows a relation between a voltage $V_{CL}$ of the capacitor line CL and a drain current Ids_2 flowing through the transistor Tr_2.

Here, the voltage of the node N can be adjusted through the transistor Tr_1. For example, the potential of the source line SL_1 is set to VDD. In this case, when the potential of the gate line GL_1 is set to be higher than or equal to a potential obtained by adding VDD to the threshold voltage Vth of the transistor Tr_1, the potential of the node N can be HIGH. Further, when the potential of the gate line GL_1 is set to be lower than or equal to the threshold voltage Vth of the transistor Tr_1, the potential of the node N can be LOW.

Thus, either a $V_{CL}$-Ids_2 curve (N=LOW) or a $V_{CL}$-Ids_2 curve (N=HIGH) can be obtained. That is, when N=LOW, Ids_2 is small at a $V_{CL}$ of 0V; accordingly, data 0 is stored. Further, when N=HIGH, Ids_2 is large at a $V_{CL}$ of 0V; accordingly, data 1 is stored. In such a manner, data can be stored.

Here, when the transistor described in Embodiment 1 is used as the transistor Tr_1, the off-state current of the transistor can be significantly reduced; therefore, unintentional leakage of an electric charge accumulated in the node N by flowing between the source and the drain of the transistor Tr_1 can be suppressed. As a result, data can be held for a long time. Further, since the threshold voltage of the transistor Tr_1 according to one embodiment of the present invention is adjusted, a voltage needed for writing can be reduced; thus, power consumption can be made small compared to a flash memory or the like.

Note that the transistor described in Embodiment 1 may be used as the transistor Tr_2.

As described above, according to one embodiment of the present invention, a semiconductor memory device with high reliability for a long time and low power consumption can be obtained.

This embodiment can be implemented in appropriate combination with the other embodiments.

Embodiment 4

A central processing unit (CPU) can be formed by using the transistor described in Embodiment 1 for at least a part of the CPU.

Figure 16A:
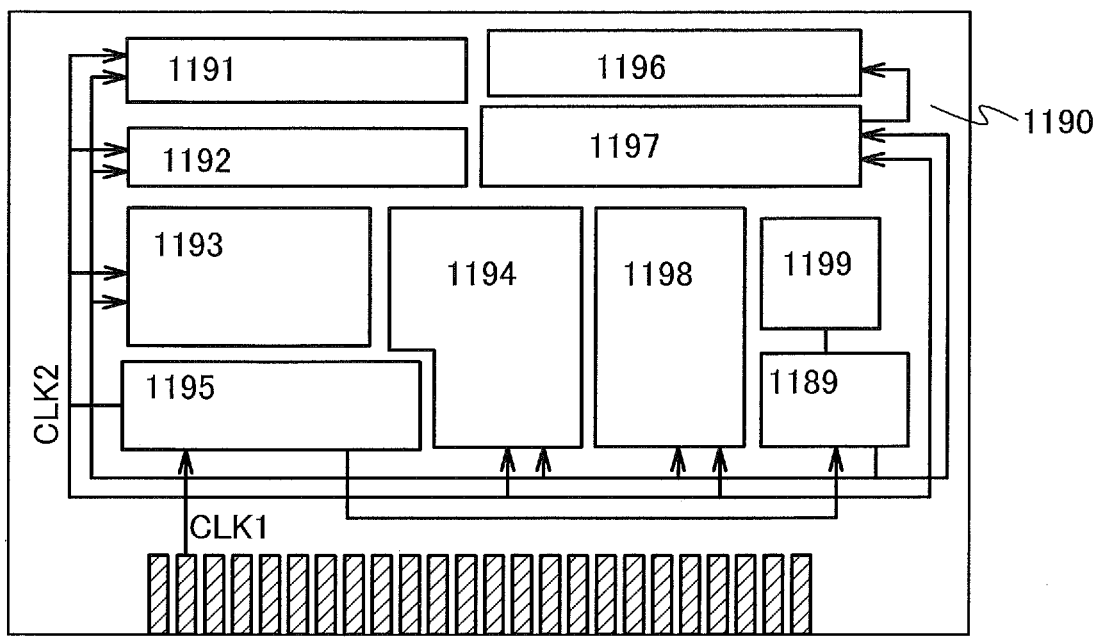
FIG. 16A is a block diagram illustrating a specific example of a CPU according to one embodiment of the present invention.

FIG. 16A is a block diagram illustrating a specific configuration of a CPU. The CPU illustrated in FIG. 16A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may each be provided over a separate chip. Obviously, the CPU illustrated in FIG. 16A is just an example in which the configuration has been simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/into the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generation portion for generating an internal clock signal CLK2 based on a reference clock signal CLK1, and supplies the clock signal CLK2 to the above circuits.

In the CPU illustrated in FIG. 16A, a memory element is provided in the register 1196. The memory element described in Embodiment 3 can be used as the memory element provided in the register 1196.

In the CPU illustrated in FIG. 16A, the register controller 1197 selects operation of holding data in the register 1196 in accordance with an instruction from the ALU 1191. That is, the register controller 1197 selects whether data is held by a phase-inversion element or a capacitor in the memory element included in the register 1196. When data holding by the phase-inversion element is selected, power supply voltage is supplied to the memory element in the register 1196. When data holding by the capacitor is selected, the data is rewritten in the capacitor, and supply of power supply voltage to the memory element in the register 1196 can be stopped.

Figure 16B:
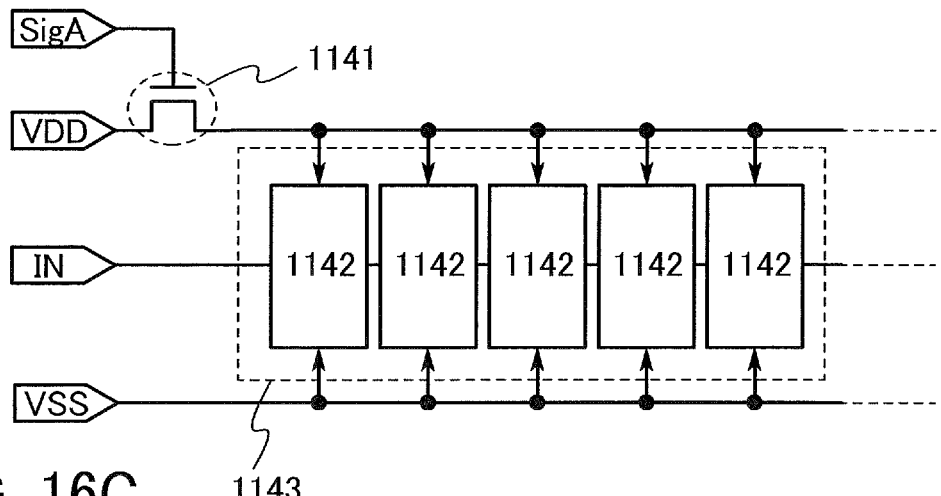
FIGS. 16B and 16C are circuit diagrams each illustrating a part of the CPU.
Figure 16C:
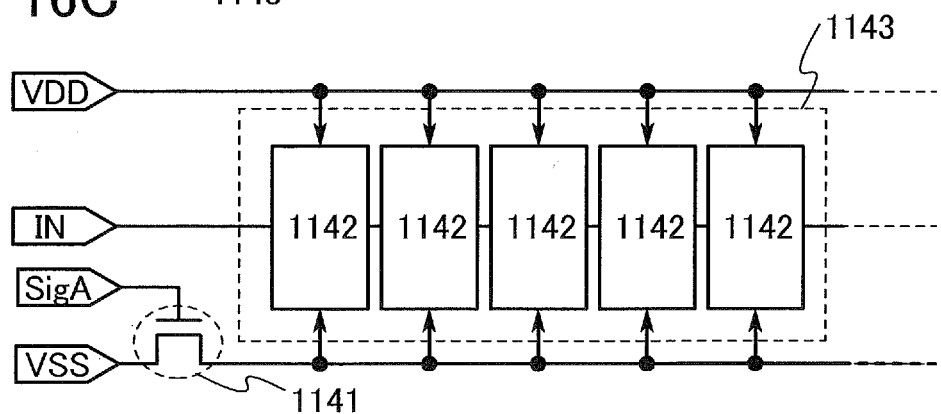

The supply of the power supply voltage can be stopped by providing a switching element between a memory element group and a node to which a power supply potential VDD or a power supply potential VSS is supplied, as illustrated in FIG. 16B or 16C. Circuits illustrated in FIGS. 16B and 16C will be described below.

In each of FIGS. 16B and 16C, as a switching element for controlling supply of a power supply potential to a memory element, an example of a configuration of a memory circuit including the transistor described in Embodiment 1 is illustrated.

The memory device illustrated in FIG. 16B includes a switching element 1141 and a memory element group 1143 including a plurality of memory elements 1142. Specifically, as each of the memory elements 1142, the memory element described in Embodiment 3 can be used. Each of the memory elements 1142 included in the memory element group 1143 is supplied with the high-level power supply potential VDD via the switching element 1141. Further, each of the memory elements 1142 included in the memory element group 1143 is supplied with a potential of a signal IN and a potential of the low-level power supply potential VSS.

In FIG. 16B, the transistor having a significantly small off-state current described in Embodiment 1 is used as the switching element 1141, and the switching of the transistor is controlled by a signal SigA supplied to a gate thereof.

Note that FIG. 16B illustrates the structure in which the switching element 1141 includes only one transistor; however, without limitation to this structure, the switching element 1141 may include a plurality of transistors. In the case where the switching element 1141 includes a plurality of transistors which serve as switching elements, the plurality of transistors may be connected to each other in parallel, in series, or in combination of parallel connection and series connection.

In FIG. 16C, an example of a memory device in which each of the memory elements 1142 included in the memory element group 1143 is supplied with the low-level power supply potential VSS via the switching element 1141 is illustrated. The supply of the low-level power supply potential VSS to each of the memory elements 1142 included in the memory element group 1143 can be controlled by the switching element 1141.

Data can be held even in the case where a switching element is provided between a memory element group and a node to which the power supply potential VDD or the power supply potential VSS is supplied, an operation of a CPU is temporarily stopped, and the supply of the power supply voltage is stopped; accordingly, power consumption can be reduced. For example, while a user of a personal computer does not stop inputting information to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

This embodiment can be implemented in appropriate combination with the other embodiments.

Embodiment 5

In this embodiment, examples of an electronic device to which any of Embodiments 1 to 4 is applied will be described.

Figure 17A:
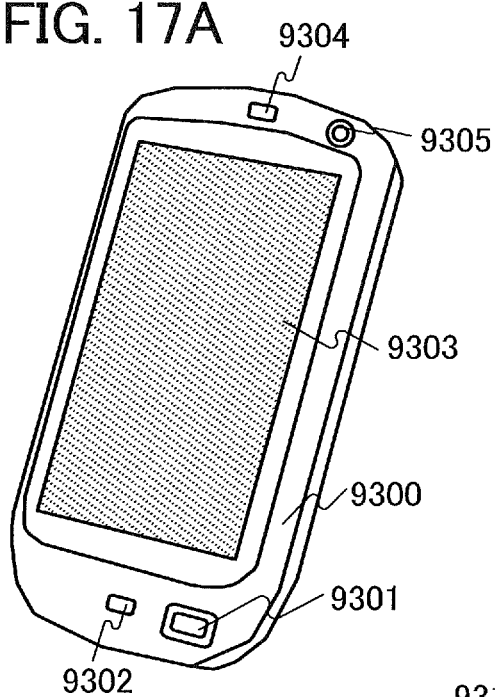
FIGS. 17A to 17C are perspective views illustrating examples of electronic devices each equipped with a semiconductor device according to one embodiment of the present invention.

FIG. 17A illustrates a portable information terminal. The portable information terminal illustrated in FIG. 17A includes a housing 9300, a button 9301, a microphone 9302, a display portion 9303, a speaker 9304, and a camera 9305, and has a function as a mobile phone. One embodiment of the present invention can be applied to the display portion 9303 and the camera 9305. Although not illustrated, one embodiment of the present invention can also be applied to an arithmetic unit, a wireless circuit, or a memory circuit in a main body.

Figure 17B:
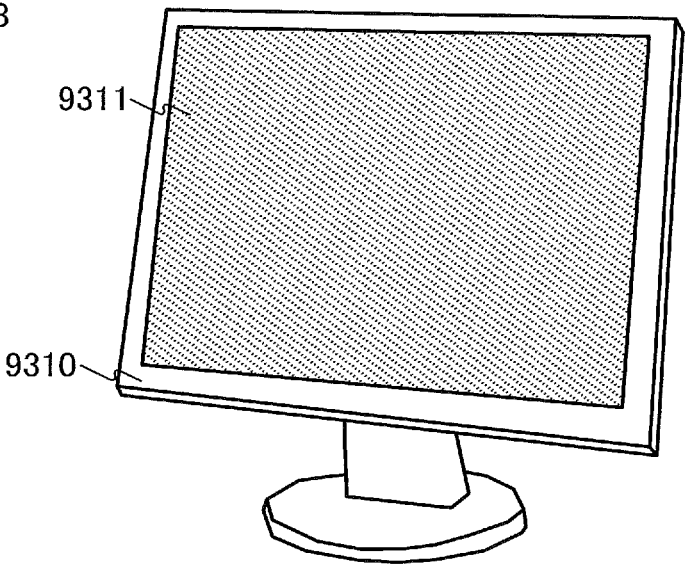

FIG. 17B illustrates a display, which includes a housing 9310 and a display portion 9311. One embodiment of the present invention can be applied to the display portion 9311. By application of one embodiment of the present invention, a display with high display quality and low power consumption can be provided even when the size of the display portion 9311 is increased.

Figure 17C:
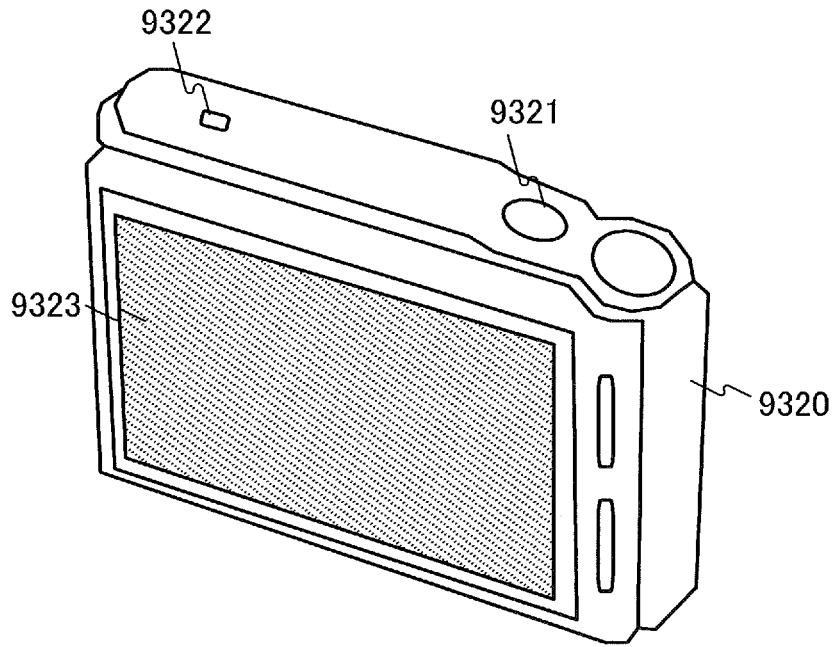

FIG. 17C illustrates a digital still camera. The digital still camera illustrated in FIG. 17C includes a housing 9320, a button 9321, a microphone 9322, and a display portion 9323. One embodiment of the present invention can be applied to the display portion 9323. Although not illustrated, one embodiment of the present invention can also be applied to a memory circuit or an image sensor.

By application of one embodiment of the present invention, power consumption of an electronic device can be reduced and the reliability of the electronic device can be improved.

This embodiment can be implemented in appropriate combination with the other embodiments.

Example 1

In this example, a specific example in which hydrogen released from an oxide semiconductor film is transferred to a hydrogen capture film through a hydrogen permeable film will be described using SIMS results of a sample subjected to heat treatment and a sample not subjected to heat treatment.

Samples in each of which a 300 nm thick oxide semiconductor film (In—Ga—Zn—O film) was deposited over a quartz substrate, a 5 nm thick silicon oxide film was deposited over the oxide semiconductor film, and a 300 nm thick oxynitride film (In—Ga—Zn—O—N film) was deposited over the silicon oxide film were prepared.

The oxide semiconductor film was deposited by a sputtering method under the following conditions: an In—Ga—Zn—O target ($In_2O_3$:ZnO:$Ga_2O_3$=1:1:2 [molar ratio]) was used, the electric power applied between the target and the substrate was set to 500 W (DC), the deposition pressure was set to 0.4 Pa, the deposition gas was argon at the flow rate of 30 sccm and oxygen at the flow rate of 15 sccm, and the temperature of the substrate surface during heat treatment was set to 200° C.

The silicon oxide film was deposited by a sputtering method under the following conditions: a synthesized quartz target was used, the deposition electric power was set to 1 kW, the deposition pressure was set to 0.4 Pa, the deposition gas was argon at the flow rate of 25 sccm and oxygen at the flow rate of 25 sccm, and the temperature of the substrate surface during heat treatment was set to 100° C.

The oxynitride film was deposited by a sputtering method under the following conditions: a In—Ga—Zn—O target ($In_2O_3$:ZnO:$Ga_2O_3$=1:1:2 [molar ratio]) was used, the deposition electric power was set to 500 W, the deposition pressure was set to 0.4 Pa, the deposition gas was argon at the flow rate of 40 sccm, and the temperature of the substrate surface during heat treatment was set to 200° C.

Figure 18A:
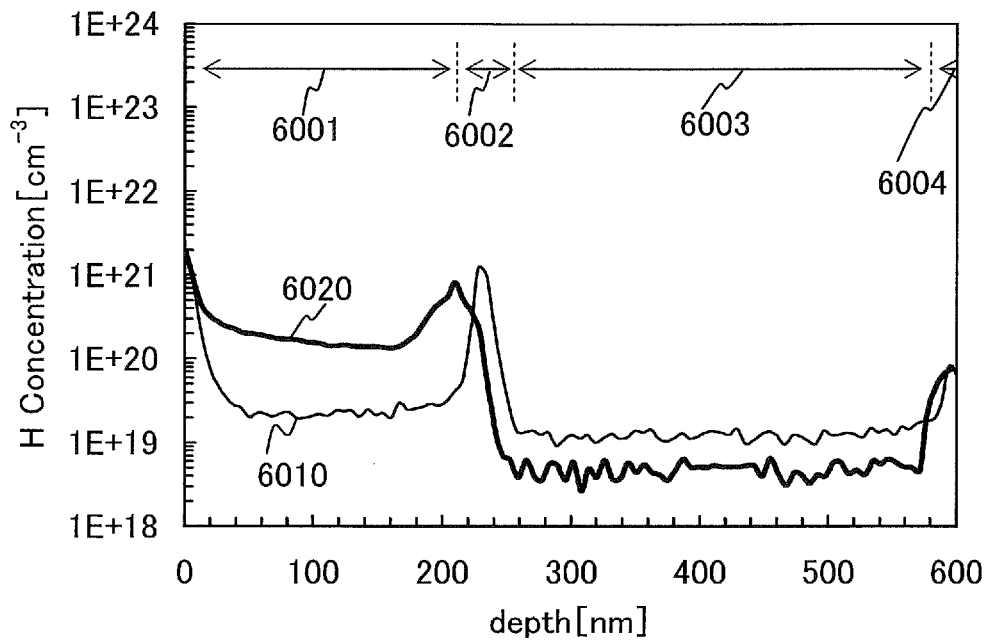
FIGS. 18A and 18B are graphs showing the concentration distribution of hydrogen and nitrogen in the depth direction measured with SIMS.
Figure 18B:
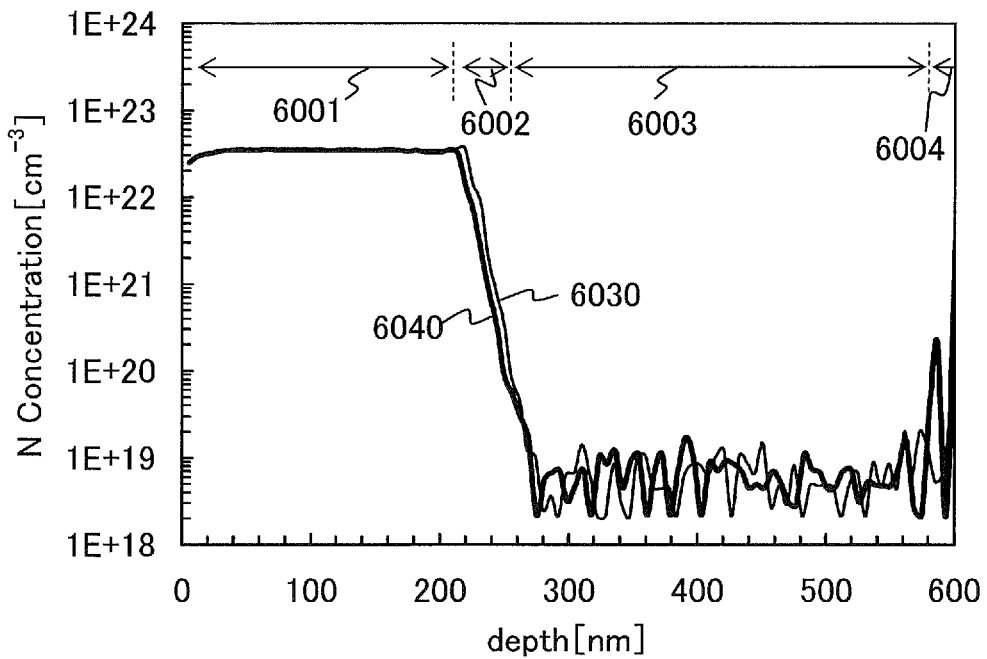

FIG. 18A shows the concentration distribution of hydrogen in the depth direction measured with SIMS, and FIG. 18B shows the concentration distribution of nitrogen in the depth direction measured with SIMS. Here, a range 6001 shows the oxynitride film, a range 6002 shows the silicon oxide film, a range 6003 shows the oxide semiconductor film, and a range 6004 shows the quartz substrate. Note that the range 6002 is not quantified. In addition, an accurate quantitative value in a region in the vicinity of each layer is not obtained due to a matrix effect. Note that the SIMS analysis was performed using IMS 7fR manufactured by CAMECA Societe par Actions Simplifiée (SAS).

In FIG. 18A, a thin line 6010 indicates the concentration distribution of hydrogen of the sample in a state immediately after the deposition and a thick line 6020 indicates the concentration distribution of hydrogen of the sample subjected to heat treatment at 550° C. in a nitrogen atmosphere for an hour after the deposition. Such concentration distribution reveals that the hydrogen concentration in the oxide semiconductor film is reduced and the hydrogen concentration in the oxynitride film is increased by performing the heat treatment, i.e., that hydrogen is transferred from the oxide semiconductor film to the oxynitride film through the silicon oxide film by the heat treatment.

In FIG. 18B, a thin line 6030 indicates the concentration distribution of nitrogen of the sample in a state immediately after deposition and a thick line 6040 indicates the concentration distribution of nitrogen of the sample subjected to heat treatment at 550° C. in a nitrogen atmosphere for an hour after the deposition. Such concentration distribution reveals that the concentration distribution of nitrogen in the samples before and after the heat treatment hardly varies.

This application is based on Japanese Patent Application Serial No. 2011-067195 filed with Japan Patent Office on Mar. 25, 2011, the entire contents of which are hereby incorporated by reference.

What is claimed is:

1. A method for manufacturing a semiconductor device comprising the steps of:
    forming a gate electrode over a substrate;
    forming a gate insulating film so as to cover the gate electrode;
    forming an oxide semiconductor film over the gate insulating film;
    forming a pair of electrodes over the oxide semiconductor film, the pair of electrodes being in contact with at least part of the oxide semiconductor film;
    forming a protective film over the oxide semiconductor film and the pair of electrodes; and
    performing heat treatment so as to release hydrogen from the oxide semiconductor film,
    wherein the protective film comprises a hydrogen capture film and a hydrogen permeable film which are stacked in this order.

2. The method for manufacturing a semiconductor device according to claim 1,
    wherein the hydrogen released from the oxide semiconductor film is transferred to the hydrogen capture film through the hydrogen permeable film by the heat treatment.

3. The method for manufacturing a semiconductor device according to claim 1,
    wherein the hydrogen permeable film comprises an oxide film, and
    wherein oxygen is transferred from the hydrogen permeable film to the oxide semiconductor film by performing the heat treatment.

4. The method for manufacturing a semiconductor device according to claim 1,
    wherein the hydrogen capture film and the oxide semiconductor film comprise at least a metal element, and
    wherein the hydrogen permeable film does not include the metal element.

5. The method for manufacturing a semiconductor device according to claim 1,
    wherein the hydrogen capture film comprises an oxynitride film containing indium.

6. The method for manufacturing a semiconductor device according to claim 1,
    wherein the hydrogen permeable film comprises a silicon oxide film or a silicon oxynitride film.

7. The method for manufacturing a semiconductor device according to claim 1,
    wherein the oxide semiconductor film comprises an In—Ga—Zn—O based film, and
    wherein the hydrogen capture film comprises an In—Ga—Zn—O—N based film.

8. The method for manufacturing a semiconductor device according to claim 1,
    wherein a thickness of the hydrogen permeable film is less than or equal to 5 nm.

9. The method for manufacturing a semiconductor device according to claim 1,
    wherein a temperature of the heat treatment is higher than 450° C. and lower than a strain point of the substrate.

10. A semiconductor device comprising:
    a base film;
    an oxide semiconductor film over the base film;
    a gate insulating film over the oxide semiconductor film;
    a gate electrode over the oxide semiconductor film with the gate insulating film provided therebetween; and
    a pair of electrodes in contact with at least part of the oxide semiconductor film,
    wherein the base film comprises a hydrogen capture film and a hydrogen permeable film which are stacked in this order.

11. The semiconductor device according to claim 10,
    wherein the hydrogen capture film comprises an oxynitride film including indium, and
    wherein the hydrogen permeable film comprises a silicon oxide film or a silicon oxynitride film.

12. The semiconductor device according to claim 10,
    wherein the oxide semiconductor film comprises an In—Ga—Zn—O based film, and
    wherein the hydrogen capture film comprises an In—Ga—Zn—O—N based film.

13. The semiconductor device according to claim 10,
    wherein a thickness of the hydrogen permeable film is less than or equal to 5 nm.

14. The semiconductor device according to claim 10,
    wherein the hydrogen permeable film is configured to transfer oxygen to the oxide semiconductor film by a heat treatment.

15. A semiconductor device comprising:
    a gate electrode;
    a gate insulating film covering the gate electrode;
    an oxide semiconductor film over the gate electrode with the gate insulating film provided therebetween;
    a pair of electrodes in contact with at least part of the oxide semiconductor film; and
    a protective film over the oxide semiconductor film,
    wherein the protective film comprises a hydrogen permeable film and a hydrogen capture film which are stacked in this order.

16. The semiconductor device according to claim 15,
    wherein the hydrogen capture film comprises an oxynitride film including indium, and
    wherein the hydrogen permeable film comprises a silicon oxide film or a silicon oxynitride film.

17. The semiconductor device according to claim 15,
    wherein the oxide semiconductor film comprises an In—Ga—Zn—O based film, and
    wherein the hydrogen capture film comprises an In—Ga—Zn—O—N based film.

18. The semiconductor device according to claim 15,
    wherein a thickness of the hydrogen permeable film is less than or equal to 5 nm.

19. The semiconductor device according to claim 15,
wherein the hydrogen permeable film is configured to transfer oxygen to the oxide semiconductor film by a heat treatment.

20. A semiconductor device comprising:
a first insulating film;
an oxide semiconductor film over the first insulating layer;
a pair of electrodes over and in contact with at least part of the oxide semiconductor film; and
a second insulating film over the oxide semiconductor film and the pair of electrodes,
wherein one of the first insulating film and the second insulating film comprises a third insulating film and a fourth insulating film which are stacked, the third insulating film being adjacent to the oxide semiconductor film,
wherein the third insulating film and the fourth insulating film are configured to transfer hydrogen from the oxide semiconductor film to the fourth insulating film through the third insulating film by a heat treatment, wherein the hydrogen is captured by the fourth insulating film.

21. The semiconductor device according to claim 20,
wherein the fourth insulating film comprises an oxynitride film including indium, and,
wherein the third insulating film comprises a silicon oxide film or a silicon oxynitride film.

22. The semiconductor device according to claim 20,
wherein the oxide semiconductor film comprises an In—Ga—Zn—O based film, and
wherein the fourth insulating film comprises an In—Ga—Zn—O—N based film.

23. The semiconductor device according to claim 20,
wherein a thickness of the third insulating film is less than or equal to 5 nm.

24. The semiconductor device according to claim 20,
wherein the third insulating film is configured to transfer oxygen to the oxide semiconductor film by a heat treatment.

* * * * *